US006944070B1

(12) United States Patent  
Proebsting et al.

(10) Patent No.: US 6,944,070 B1  
(45) Date of Patent: Sep. 13, 2005

(54) INTEGRATED CIRCUIT DEVICES HAVING HIGH PRECISION DIGITAL DELAY LINES THEREIN

(75) Inventors: Robert J. Proebsting, Senora, CA (US); Cesar A. Talledo, Sunnyvale, CA (US); David J. Pilling, Los Altos Hills, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/880,893

(22) Filed: Jun. 30, 2004

Related U.S. Application Data

(63) Continuation of application No. 10/643,208, filed on Aug. 18, 2003, now Pat. No. 6,856,558.

(60) Provisional application No. 60/412,514, filed on Sep. 20, 2002.

(51) Int. Cl.[7] .............................................. G11C 7/00
(52) U.S. Cl. ..................... 365/193; 365/194; 365/233
(58) Field of Search ............................... 365/193, 194, 365/191, 233, 236; 327/158, 262, 277

(56) References Cited

U.S. PATENT DOCUMENTS

| 5,309,035 | A | * | 5/1994 | Watson et al. ............... 327/141 |
| 5,317,219 | A | | 5/1994 | Lupi et al. .................... 307/603 |
| 5,374,860 | A | | 12/1994 | Llewellyn .................... 327/276 |
| 5,485,490 | A | | 1/1996 | Leung et al. ................. 375/371 |
| 5,561,692 | A | | 10/1996 | Maitland et al. ............. 375/371 |
| 5,614,855 | A | | 3/1997 | Lee et al. ..................... 327/158 |
| 5,719,515 | A | | 2/1998 | Danger ......................... 327/270 |
| 5,777,567 | A | * | 7/1998 | Murata et al. ................ 341/100 |
| 5,818,769 | A | | 10/1998 | Tweed et al. ................. 365/194 |
| 5,828,257 | A | | 10/1998 | Masleid ....................... 327/276 |
| 5,844,954 | A | | 12/1998 | Casasanta et al. ........... 375/373 |
| 5,847,616 | A | | 12/1998 | Ng et al. ....................... 331/57 |
| 5,910,740 | A | | 6/1999 | Underwood ................. 327/149 |
| 5,923,597 | A | | 7/1999 | Tweed et al. ................. 365/194 |

(Continued)

OTHER PUBLICATIONS

Lee et al., "A 2.5 V CMOS Delay-Locked Loop for an 18 Mbit, 500 Megabyte/s DRAM," IEEE Journal of Solid-State Circuits, vol. 29, No. 12, Dec. 1994, pp. 1491-1496.

(Continued)

Primary Examiner—Gene N. Auduong  
(74) Attorney, Agent, or Firm—Myers Bigel Sibley & Sajovec

(57) ABSTRACT

Integrated circuit delay devices include a digital delay line that is configured to provide a percent-of-clock period delay to a timing signal accepted at an enabled one of a plurality of injection ports thereof. The digital delay line may be responsive to an injection control signal having a value that sets a length of the delay by specifying a location of the enabled one of the plurality of injection ports, with the end of the delay line being a fixed output port. A delay line control circuit is also provided that is responsive to a clock signal having a period from which the percent-of-clock period delay is preferably measured. The delay line control circuit is configured to generate the injection control signal by counting multiple cycles of a high frequency ring oscillator signal having a period less than, and typically substantially less than, the clock period, over a time interval having a duration greater than, and typically substantially greater than, the clock period. The ring oscillator signal may be generated by a ring oscillator having a relatively small number of stages and the time interval may be sufficiently long so that a large number of cycles of the ring oscillator signal may be counted over many periods of the clock signal.

60 Claims, 19 Drawing Sheets

U.S. PATENT DOCUMENTS

| | | | |
|---|---|---|---|
| 6,115,769 A * | 9/2000 | Anderson et al. | 710/305 |
| 6,125,157 A | 9/2000 | Donnelly et al. | 375/371 |
| 6,134,180 A | 10/2000 | Kim et al. | 365/233 |
| 6,194,937 B1 | 2/2001 | Minami | 327/270 |
| 6,239,892 B1 | 5/2001 | Davidson | 359/135 |
| 6,255,969 B1 | 7/2001 | Crayford | 341/100 |
| 6,275,899 B1 | 8/2001 | Savell et al. | 711/118 |
| 6,285,172 B1 | 9/2001 | Torbey | 323/237 |
| 6,285,229 B1 | 9/2001 | Chu et al. | 327/277 |
| 6,288,574 B1 | 9/2001 | Neary | 327/12 |
| 6,294,937 B1 * | 9/2001 | Crafts et al. | 327/158 |
| 6,313,621 B1 | 11/2001 | Zwack | 324/76.52 |
| 6,313,676 B1 | 11/2001 | Abe et al. | 327/158 |
| 6,348,827 B1 | 2/2002 | Fifield et al. | 327/278 |
| 6,356,099 B1 | 3/2002 | Lee et al. | 326/24 |
| 6,356,158 B1 | 3/2002 | Lesea | 331/11 |
| 6,359,489 B1 | 3/2002 | Huang | 327/291 |
| 6,366,150 B1 | 4/2002 | Ishimi | 327/276 |
| 6,400,202 B1 | 6/2002 | Fifield et al. | 327/291 |
| 6,411,142 B1 | 6/2002 | Abbasi et al. | 327/156 |
| 6,477,110 B2 | 11/2002 | Yoo et al. | 365/233 |
| 6,501,312 B1 | 12/2002 | Nguyen | 327/161 |
| 6,501,328 B1 | 12/2002 | Gauthier et al. | 327/551 |
| 6,504,408 B1 | 1/2003 | von Kaenel | 327/158 |
| 6,518,807 B1 | 2/2003 | Cho | 327/158 |
| 6,539,072 B1 | 3/2003 | Donnelly et al. | 375/371 |
| 6,567,490 B1 * | 5/2003 | Hayashi et al. | 375/376 |
| 6,584,021 B2 | 6/2003 | Heyne et al. | 365/194 |
| 6,586,978 B2 | 7/2003 | Stief | 327/158 |
| 6,593,786 B2 | 7/2003 | Jung | 327/158 |
| 6,664,838 B1 | 12/2003 | Talledo | 327/277 |
| 2003/0052719 A1 | 3/2003 | Na | 327/158 |
| 2003/0058014 A1 | 3/2003 | Krishnamurty | 327/158 |
| 2003/0067335 A1 | 4/2003 | von Kaenel | 327/158 |
| 2003/0071668 A1 | 4/2003 | Starr | 327/157 |
| 2003/0090284 A1 | 5/2003 | Weis et al. | 327/182 |
| 2003/0090296 A1 | 5/2003 | Yoo | 327/12 |
| 2003/0095009 A1 | 5/2003 | Gomm et al. | 331/57 |
| 2003/0099321 A1 | 5/2003 | Juan et al. | 375/376 |
| 2003/0108139 A1 | 6/2003 | Jung | 375/376 |
| 2003/0117193 A1 | 6/2003 | Lee | 327/158 |
| 2003/0117194 A1 | 6/2003 | Lee | 327/158 |
| 2003/0141910 A1 | 7/2003 | Reindl | 327/158 |
| 2003/0151433 A1 | 8/2003 | Takai | 327/158 |
| 2003/0154417 A1 | 8/2003 | Drexler | 713/400 |
| 2003/0154447 A1 | 8/2003 | Gauthier et al. | 716/2 |
| 2004/0116160 A1 * | 6/2004 | Deas et al. | 455/570 |

OTHER PUBLICATIONS

Ryan, Kevin, "DDR SDRAM Functionality and Controller Read Data Capture," Micron Technology, Inc., vol. 8, Issue 3, 1999, pp. 1-24.

* cited by examiner

| FIG. 2A |
| FIG. 2B |

INTEGRATED CIRCUIT DEVICES HAVING HIGH PRECISION DIGITAL DELAY LINES THEREIN

REFERENCE TO PRIORITY APPLICATIONS

This application is a continuation of U.S. application Ser. No. 10/643,208, filed Aug. 18, 2003, now U.S. Pat. No. 6,856,558, which claims priority to U.S. Provisional Application Ser. No. 60/412,514, filed Sep. 20, 2002, the disclosures of which are hereby incorporated herein by reference.

FIELD OF THE INVENTION

The present invention relates to integrated circuit devices and, more particularly, to integrated circuit devices having digital delay lines therein.

BACKGROUND OF THE INVENTION

A delay line is often used to generate an output timing signal that is delayed a fixed fraction of a period of a clock signal after receipt of an input timing signal, which may, in some applications, be the clock signal. A delay line may use a fixed number of voltage controlled delay elements that are cascaded together into a string of delay elements. The delay associated with each delay element in a fixed-length string may be a function of an applied analog control voltage. Alternatively, a digital delay line may use a variable number of delay elements, with each delay element having a more-or-less fixed delay. In this latter case, the number of delay elements may be chosen to yield the desired delay.

Two important specifications of a digital delay line are its resolution and its power supply noise immunity. The resolution is simply the accuracy with which the delay line can achieve the desired delay. If, for example, each delay element in a digital delay line has a 100 ps delay, then in an ideal case, of +/−50% delay variation, the actual delay provided by the delay line will be within ±50 ps of the desired delay and relatively few delay elements will be needed to provide the desired delay. In contrast, if each delay element has a 50 ps delay, then ideally the actual delay will be within ±25 ps of the desired delay, but more delay elements will be required to provide the desired delay. For high resolution, a small delay per stage is typically required. Power supply noise immunity has to do with the ability of a delay element to maintain an established delay in the presence of power supply and ground noise (including power supply level changes). A delay line which exhibits minimal change in delay in the presence of power supply and ground noise is important because changes in delay that result from unpredictable noise may cause significant undesirable changes in the output timing of the delay line. Efforts have been made to minimize power supply noise by using separate power supply pins that serve only the delay line when the device is packaged. However, because an integrated circuit chip substrate is commonly one of the power supply nodes, and because this node is typically common with the noise generating circuitry on the chip and the delay line, the use of separate power supply pins may not provide sufficient noise suppression. Other important specifications of a delay line are its power consumption and the total layout area required for its circuitry, which is generally proportional to transistor count.

SUMMARY OF THE INVENTION

Integrated circuit delay devices according to embodiments of the present invention have high resolution and excellent power supply and ground noise immunity. The delay devices may also be designed to have low power consumption requirements and low transistor count. In some embodiments, these delay devices include a digital delay line that is configured to provide a percent-of-clock period delay to a timing signal accepted at an enabled one of a plurality of injection ports thereof. The digital delay line may be responsive to an injection control signal having a value that sets a length of the delay by specifying a location of the enabled one of the plurality of injection ports, with the end of the delay line being a fixed output port.

A delay line control circuit is also provided that is responsive to a clock signal having a period from which the percent-of-clock period delay is preferably measured. This clock signal may be a highly accurate clock signal that is generated by a delay locked loop (DLL). The delay line control circuit is configured to generate the injection control signal by counting multiple cycles of a high frequency ring oscillator signal having a period less than, and typically substantially less than, the clock period, over a time interval having a duration greater than, and typically substantially greater than, the clock period. The ring oscillator signal may be generated by a ring oscillator having a relatively small number of stages and the time interval may be sufficiently long so that a large number of cycles of the ring oscillator signal may be counted over many periods of the clock signal. In this manner, a cycle count derived from the ring oscillator may be averaged over many periods of the clock signal. This makes the cycle count more stable and less sensitive to transient changes in the clock period. The cycle count is then evaluated to determine an appropriate delay to be provided by the digital delay line.

The digital delay line includes a cascaded string of delay elements that are each connected to a respective one of the plurality of injection ports. These delay elements may constitute differential amplifier delay elements. Each of the differential amplifier delay elements may include a pair of differential inputs and a pair of differential outputs. The plurality of injection ports may be electrically coupled together to receive a timing signal, which in some embodiments may be treated as a pair of differential timing signals having opposite phases. The injection control signal is preferably a multi-bit injection control signal that is derived directly or indirectly from the cycle count. The injection control signal designates which one of the plurality of injection ports is enabled to accept the timing signal. Each of the injection ports may be coupled to an output of a respective delay element, and the injection control signal may be operable to disable the delay element associated with the enabled injection port. Each of the injection ports may also comprise a respective pair of differential injection terminals that, when enabled, accept the pair of differential timing signals and pass the accepted timing signals to a pair of differential outputs of a respective delay element, which has been disabled.

According to preferred aspects of these embodiments, the delay elements in the cascaded string each include a pair of PMOS load transistors having gate electrodes electrically coupled to a first bias signal line and current carrying terminals (e.g., drain terminals) electrically coupled to a power supply line. To enhance the noise immunity characteristics of the digital delay line, a first bias signal generator is provided to float the first bias signal line and the gate electrodes connected thereto at a first bias voltage when the digital delay line is active. The floating of the gate electrodes of the load transistors will support more constant gate-to-source voltages across the load transistors when noise is present on the power supply line. These more constant voltages, which are a consequence of capacitive coupling between each gate electrode and source terminal of a respective load transistor, provide more uniform I–V characteristics for the delay elements when the delay line is active. These more uniform I–V characteristics will necessarily translate into more uniform delay characteristics for each of the delay elements, notwithstanding the presence of power supply noise.

Moreover, to provide delay elements having more uniform delay characteristics in the presence of sustained voltage level shifts on the power supply line, the first bias signal generator is configured to intermittently pump the first bias signal line with positive displacement current if the voltage level shifts on the power supply line are positive and with negative displacement current if the voltage level shifts are negative. These enhanced noise immunity characteristics may also be present within the ring oscillator. In particular, the ring oscillator may include a plurality of differential amplifier delay elements that are identical to the delay elements within the digital delay line. Thus, the PMOS load transistors within the ring oscillator delay elements may also have gate electrodes that are electrically coupled to the first bias signal line and pumped with positive or negative displacement current by the first bias signal generator.

According to additional aspects of preferred embodiments of delay devices, the delay line control circuit may include a divide-by-N clock generator having an input that is responsive to the clock signal and a first output that is electrically coupled to an enable input of the ring oscillator, where N is a positive integer. In this manner, the ring oscillator may be periodically enabled at a frequency that is fraction of the frequency of the clock signal. For example, a first periodic signal generated at the first output of the divide-by-N clock generator may have a period that is sixteen times longer than the period of the clock signal. In this event, the ring oscillator may be enabled during one-half of the period of the first periodic signal. This means that if the period of the clock signal is 10 ns, the ring oscillator will be enabled for 80 ns and then disabled for 80 ns in alternating sequence.

The delay line control circuit may also include a multi-stage counter that is electrically coupled to an output of the ring oscillator. This counter is configured to provide a count value that is proportional to the number of cycles of the oscillator signal generated at the output of the ring oscillator during each period that the ring oscillator is active. A reset input of the counter is also provided so that the counter can be automatically reset to a zero count value just prior to the ring oscillator becoming enabled. This reset input may receive a "reset" pulse that is generated by a first pulse generator. This first pulse generator may be configured to decode a first plurality of outputs of the divide-by-N clock generator into the reset pulse.

The delay line control circuit may also include a first multi-bit wide latch having data inputs that are electrically coupled to outputs of the counter. This first multi-bit wide latch may be responsive to a first "store" pulse that causes the latch to automatically load a count value generated by the counter in-sync with the first store pulse. This first store pulse may be generated by a second pulse generator. This second pulse generator may be configured to decode a second plurality of outputs of the divide-by-N clock generator and generate a short duration pulse when the ring oscillator is inactive and the count value generated by the counter is valid.

A second multi-bit wide latch may also be provided in some embodiments. This second multi-bit latch is responsive to a second "store" pulse that may be generated external to the delay device. The second multi-bit wide latch may be otherwise identical to the first multi-bit latch and may be configured as an additional latch stage that receives the count value held by the first multi-bit latch. The first multi-bit latch may be automatically loaded with a new count value after every active period of the ring oscillator. However, the second multi-bit latch may be loaded with the count value held by the first multi-bit latch only when the externally generated second store pulse is active. The externally generated second store pulse may be selectively switched to an active level whenever the delay provided by the digital delay line is to be updated. At this point, a decoder having inputs electrically coupled to outputs of the second multi-bit latch will be enabled to generate an updated multi-bit injection control signal that is provided to injection control terminals of the digital delay line.

Further embodiments of the present invention include integrated circuit delay elements that utilize internally floating nodes to improve noise immunity characteristics. Each of these delay elements includes a differential amplifier delay element having a pair of differential inputs and a pair of differential outputs. The differential inputs are electrically coupled to gate electrodes of a first pair of NMOS input transistors. The first pair of NMOS input transistors have first current carrying terminals (e.g., source terminals) that are commonly connected. A pull-down current source is also provided. The pull-down current source is electrically coupled to the first current carrying terminals of the first pair of input transistors. In some embodiments, the pull-down current source may include a pair of NMOS transistors connected serially (source-to-drain) in a totem-pole arrangement that extends between the source terminals of the input transistors and a reference line (e.g., GND).

First and second PMOS load transistors are also provided. The first PMOS load transistor has a first current carrying terminal electrically coupled to a true one of the pair of differential outputs and a second current carrying terminal electrically coupled to a power supply line. The second PMOS load transistor has a first current carrying terminal electrically coupled to a complementary one of the pair of differential outputs and a second current carrying terminal electrically coupled to the power supply line. First and second bias signal lines are also provided. The first bias signal line is electrically coupled to gate electrodes of the first and second PMOS load transistors and the second bias signal line is electrically connected to a control input of the pull-down current source. To improve noise immunity characteristics, the first and second bias signal lines are floated at respective bias voltage levels when the differential amplifier is active. To achieve these characteristics, first and second bias signal generators are provided for driving the first and second bias signal lines. The first bias signal generator is configured to float the first bias signal line at a first bias voltage when the differential amplifier is active and is further configured to pump the first bias signal line with positive or negative displacement current when the differential amplifier is inactive. Similarly, the second bias signal generator is configured to float the second bias signal line at a second bias voltage when the differential amplifier is active and is further configured to pump the second bias signal line with positive or negative displacement current when the differential amplifier is inactive.

DESCRIPTION OF PREFERRED EMBODIMENTS

Figure 1A:
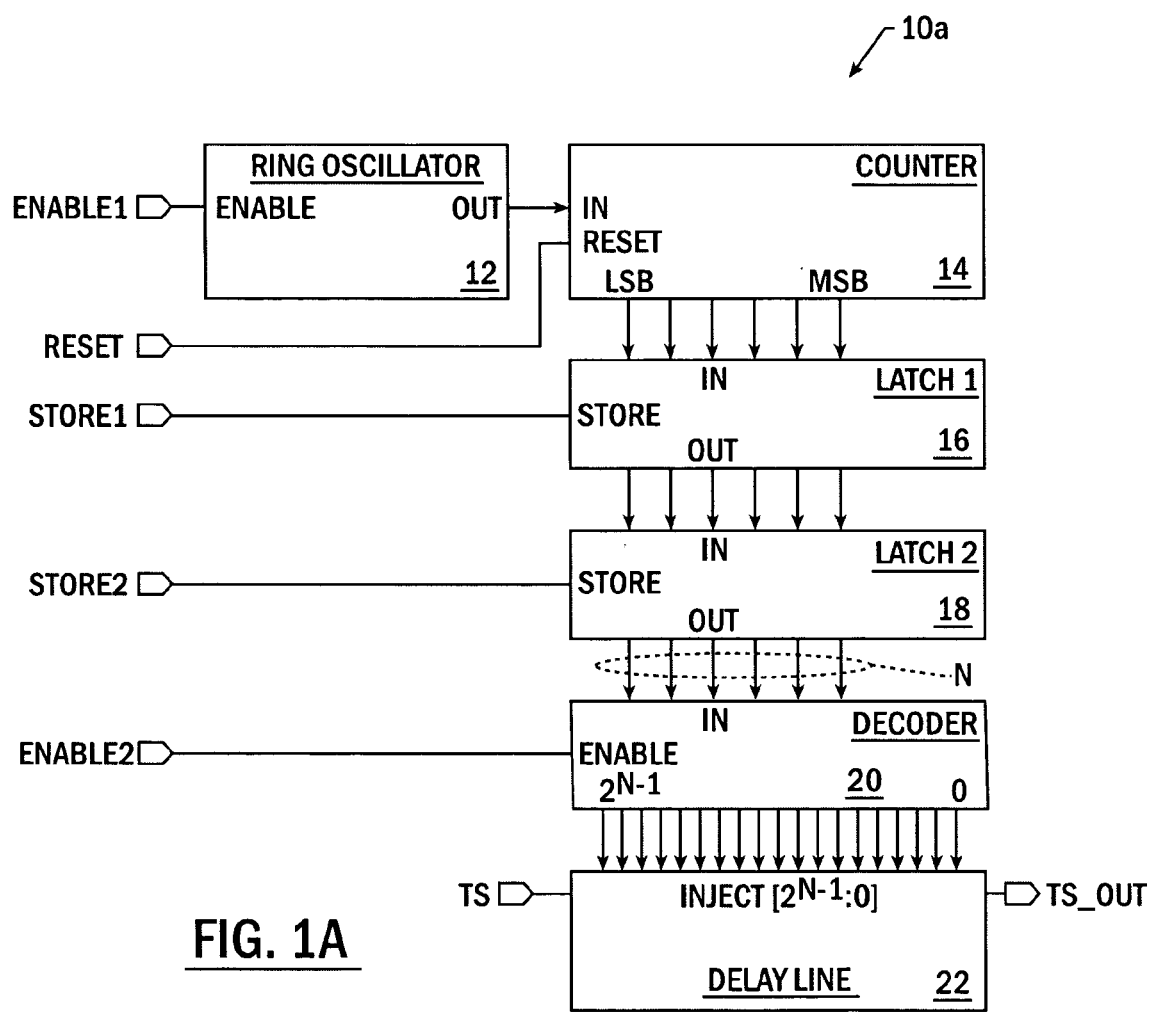
FIG. 1A is a block diagram of an integrated circuit delay device according to first embodiments of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. When used in conjunction with a signal name, the suffix "B" or prefix symbol "/" denotes a complementary signal relative to another signal and/or an active low signal.

Referring now to FIG. 1A, integrated circuit delay devices 10a according to first embodiments of the present invention will be described. In the illustrated delay device 10a, a digital delay line 22 is provided. The digital delay line 22 generates a delayed timing signal TS_OUT at an output thereof. This output may be a fixed output that is active whenever the delay line 22 is active. The digital delay line 22 is responsive to an input timing signal, shown as TS, and a multi-bit wide injection control signal, shown as INJECT $[2^{N-1}:0]$. As described more fully hereinbelow, the timing signal TS, or related timing signal(s) derived therefrom, is provided to a plurality of injection ports associated with the digital delay line 22 and the injection control signal INJECT selects which one of the plurality of injection ports is active to accept the timing signal TS. In this manner, the injection control signal INJECT defines the number of delay elements in the delay line that the timing signal TS is delayed by or, equivalently, the number of consecutive delay elements in a cascaded string thereof that extend between an active one of the plurality of injection ports and the output of the digital delay line 22. In typical embodiments, the timing signal TS may be a clock signal.

The illustrated delay device 10a also includes a delay line control circuit that provides signals to the digital delay line 22. This delay line control circuit includes a ring oscillator 12 that generates a ring oscillator clock signal RO_CLK at an output OUT thereof. The ring oscillator 12 may be responsive to an enable signal, shown as ENABLE1. This enable signal ENABLE1 may be an active high (or active low) signal that defines the time intervals when the ring oscillator 12 is active. As described more fully hereinbelow, the ring oscillator 12 may comprise a plurality of delay elements that are similar to or, more preferably, identical to the delay elements within the digital delay line 22. A counter 14 is also provided. The counter 14 is configured to count the number of oscillations of the ring oscillator clock signal RO_CLK generated at the output OUT of the ring oscillator 12. The counter 14 may comprise a cascaded string of divide-by-two latch elements that are responsive to a reset signal RESET. The counter 14 is shown as providing an -bit binary count value at an output thereof, where N is an integer having a value equal to six (6) in the illustrated embodiment. Other values of N are also possible and may be implemented in a similar manner. The 6-bit count value includes a least significant bit (LSB) and a most significant bit (MSB). Each bit of this 6-bit count value may be generated at an output of a respective latch element within the cascaded string of divide-by-two latch elements.

According to a preferred aspect of the illustrated delay device 10a, the counter 14 may include a sub-string of one or more latch elements that do not contribute to the count value. Thus, for example, the counter 14 may comprise a cascaded string of eight (8) divide-by-two latch elements and this string may be divided into two (2) front-end latch elements, which advantageously do not contribute to the count value, and six (6) back-end latch elements that do contribute to the count value. Based on this configuration of the counter 14, the recordation by the counter 14 of 80 consecutive cycles of the ring oscillator clock signal during an active time interval will translate into a 6-bit count value having a value equal to 20 (i.e., 80×½×½=20, which may be expressed in binary form as 001010 (LSB-MSB)). This aspect of the delay device 10a is described more fully hereinbelow with respect to FIG. 2 and elsewhere.

The delay device 10a of FIG. 1A also includes a first multi-bit wide latch 16 that is responsive to a strobe signal, shown as STORE1, which will be referred to herein as a first store signal. In response to a leading edge of the first store signal, the -bit count value generated by the counter 14 will be latched into the first multi-bit wide latch 16. As described more fully hereinbelow, logic may be provided for automatically generating the reset signal RESET as a pulse to the counter 14 shortly before each active interval of the ring oscillator 12. This logic may also automatically generate the first store signal STORE1 as a pulse to the first multi-bit wide latch 16 shortly after each active interval of the ring oscillator 12. In this manner, the first multi-bit wide latch 16 will retain a regularly updated count value that is proportional to the number of consecutive oscillations of the ring oscillator 12 that occurred during a respective active time interval.

A second multi-bit wide latch 18 may also be provided for isolating the outputs of the first multi-bit wide latch 16 from the inputs of a decoder 20. This decoder 20 may operate to automatically and asynchronously decode a count value provided to its inputs into the injection control signal INJECT using combinational logic. In particular, the second multi-bit wide latch 18 may operate to selectively transfer a current count value held by the first multi-bit wide latch 16 to the decoder 20 when the digital delay line 22 is inactive and has been selected to receive an updated injection control signal INJECT. This transfer operation may be performed by control circuitry (not shown) provided external to the delay device 10a. For example, the second multi-bit wide latch 18 may receive a strobe signal generated by the control circuitry. This strobe signal, which is shown as STORE2, will be referred to herein as a second store signal. This second store signal STORE2 may be represented by pulses that occur intermittently and less frequently, and typically substantially less frequently, than the more closely and regularly spaced pulses that represent the first store signal STORE1.

The decoder 20 is illustrated as having N inputs that receive the count value held by the second multi-bit wide latch 18. The decoder 20, which is responsive to an enable signal, shown as ENABLE2, is configured to decode the N inputs into $2^N$ outputs in a conventional manner when enabled. For example, if the 6-bit count value provided to the inputs of the decoder 20 is 0=[000000], where the leftmost bit is the least significant bit (LSB) and the rightmost bit is the most significant bit (MSB), then the decoder 20, if enabled, will generate the following output: INJECT [63:1]=1 and INJECT[0]=0, which is an active low signal. If, on the other hand, the 6-bit count value provided to the inputs of the decoder 20 is 63=[111111], then the decoder 20 will generate the following output: INJECT[63]=0 and INJECT[62:0]=1. Similarly, if the 6-bit count value provided to the inputs of the decoder 20 is 61=[101111], then the decoder 20 will generate the following output: INJECT [63:62]=1, INJECT[61]=0 and INJECT[60:0]=1. The 64 possible values of the injection control signal INJECT are illustrated below:

| COUNT (LSB→MSB) | INJECT[63:0] |
|---|---|
| 000000 = 0 | [11111 ... 1110] |
| 100000 = 1 | [11111 ... 1101] |
| 010000 = 2 | [11111 ... 1011] |
| . | . |
| . | . |
| . | . |
| 001111 = 60 | [11101 ... 1111] |
| 101111 = 61 | [11011 ... 1111] |
| 011111 = 62 | [10111 ... 1111] |
| 111111 = 63 | [01111 ... 1111] |

The 64 possible values of the injection control signal INJECT correlate to 64 possible configurations of the digital delay line 22. For example, if the injection control signal INJECT[63:0]=[11111 ... 1110], which corresponds to a count value of "0", then the digital delay line 22 will provide no active delay elements in the delay path of the timing signal TS. In this case, the timing signal TS will be provided directly to an input of a signal buffer that drives the output of the digital delay line with TS_OUT. Alternatively, if the injection control signal INJECT[63:0]=[01111 ... 1111], which corresponds to a count value of "63", then the digital delay line 22 will provide 63 active delay elements in the delay path of the timing signal TS. Finally, if the decoder 20 is disabled (e.g., ENABLE2=0), then the injection control signal INJECT[63:0]=[11111 ... 1111]. In this case, none of the injection ports of the digital delay line 22 will be enabled to accept the timing signal TS and the output of the digital delay line 22 will be held at a fixed logic level. These aspects of the digital delay line 22 will be more fully described hereinbelow.

Figure 1B:
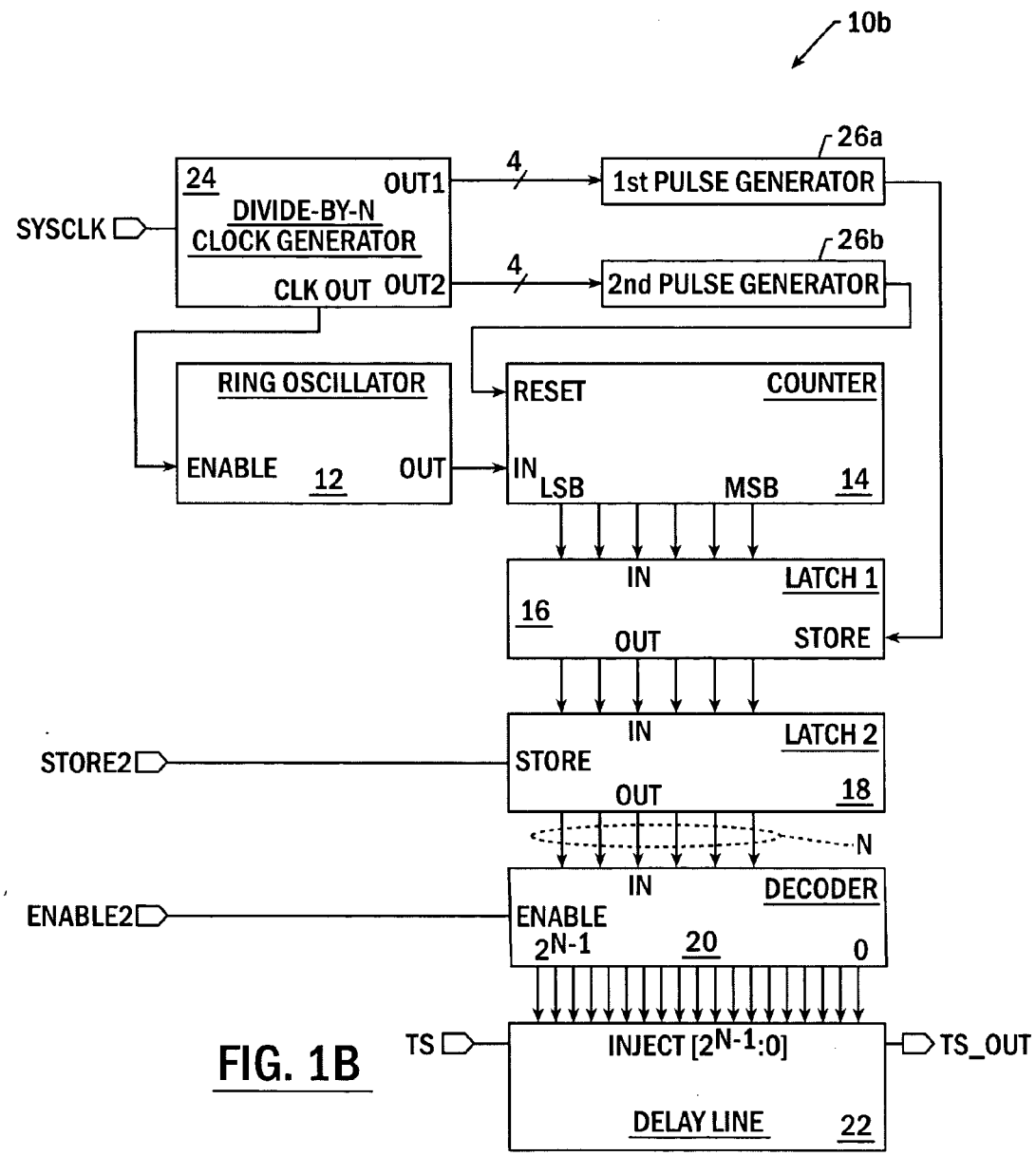
FIG. 1B is a block diagram of an integrated circuit delay device according to second embodiments of the present invention.

Referring now to FIG. 1B, integrated circuit delay devices 10b according to second embodiments of the present invention will be described. The illustrated delay device 10b of FIG. 1B, which is similar to the delay device 10a of FIG. 1A, utilizes a modified delay line control circuit. This modified delay line control circuit includes a divide-by-N clock generator 24 and first and second pulse generators 26a and 26b. The clock generator 24 may be responsive to a system clock signal, shown as SYSCLK. This system clock signal may be a highly accurate clock signal that is generated by a delay locked loop (DLL) (not shown). The clock generator 24 continuously generates an output clock signal, shown as CLK_OUT, which is provided to an enable input of the ring oscillator 12. As described more fully hereinbelow with respect to FIGS. 2 and 11, the ring oscillator 12 may be configured to be active during each active period of the output clock signal CLK_OUT. This output clock signal CLK_OUT is shown as clock signal CK4 in FIGS. 2 and 11.

The output clock signal CLK_OUT may have a period that is N times greater than a period of the system clock signal SYSCLK, where $N=2^x$ and x is a positive integer greater than zero. In an exemplary embodiment, the clock generator 24 may include four (4) divide-by-two latch elements in a multi-stage string and the output clock signal CLK_OUT may be generated by the last divide-by-two latch element in the string. In this example, the output clock signal CLK_OUT will have a period that is sixteen (16) times the period of the system clock signal (i.e., $N=16=2^4$). Accordingly, if a period of the system clock signal SYSCLK is 10 ns, then the output clock signal CLK_OUT will have a period of 160 ns and the ring oscillator 12 will be active during each first half or second half of the 160 ns clock period.

The second pulse generator 26b is configured to periodically generate a pulse that is provided to a reset input of the counter 14. These "reset" pulses may be timed to reset the counter 14 prior to each time interval when the ring oscillator 12 is active. In contrast, the first pulse generator 26a is configured to periodically generate a pulse that is provided to a store input of the first latch 16. These "store" pulses may be timed to latch the count value generated at the output of the counter 14 after each time interval when the ring oscillator 12 is active. Thus, during each time interval when the ring oscillator 12 is inactive, a store pulse may be generated to transfer the count value from the counter 14 to the first latch 16 and then a reset pulse may follow a short time later to reset the counter 14. These aspects of the first and second pulse generators 26a and 26b are more fully described hereinbelow with respect to FIGS. 2 and 11.

Accordingly, in the integrated circuit delay device 10b of FIG. 1B, the clock generator 24 can be used to synchronize the active periods of the ring oscillator 12 with the timing of the transfer of the count value to the first latch 16 and the resetting of the counter 14. This automated synchronization causes the first latch 16 to be regularly updated with a new count value that accurately reflects upward or downward changes in the number of relatively high frequency oscillations that are generated at the output of the ring oscillator 12 during a respective active time interval. In this manner, increases or decreases in the period of the system clock signal SYSCLK will be accurately reflected in corresponding increases or decreases in the count value recorded by the counter 14. As described more fully hereinbelow, these upward or downward changes in the count value recorded by the counter 14 can translate into corresponding upward or downward changes in the number of active delay elements within the digital delay line 22, if and when the second store signal STORE2 is made active to transfer the count value retained by the first latch 16 to the second latch 18. In this manner, upward or downward changes in the period of the system clock signal SYSCLK will translate into corresponding upward or downward changes in the number of active delay elements within the digital delay line 22, so that a highly accurate and reliable percent-of-clock period delay can be achieved between the timing signal TS and the output timing signal TS_OUT.

Figure 1C:
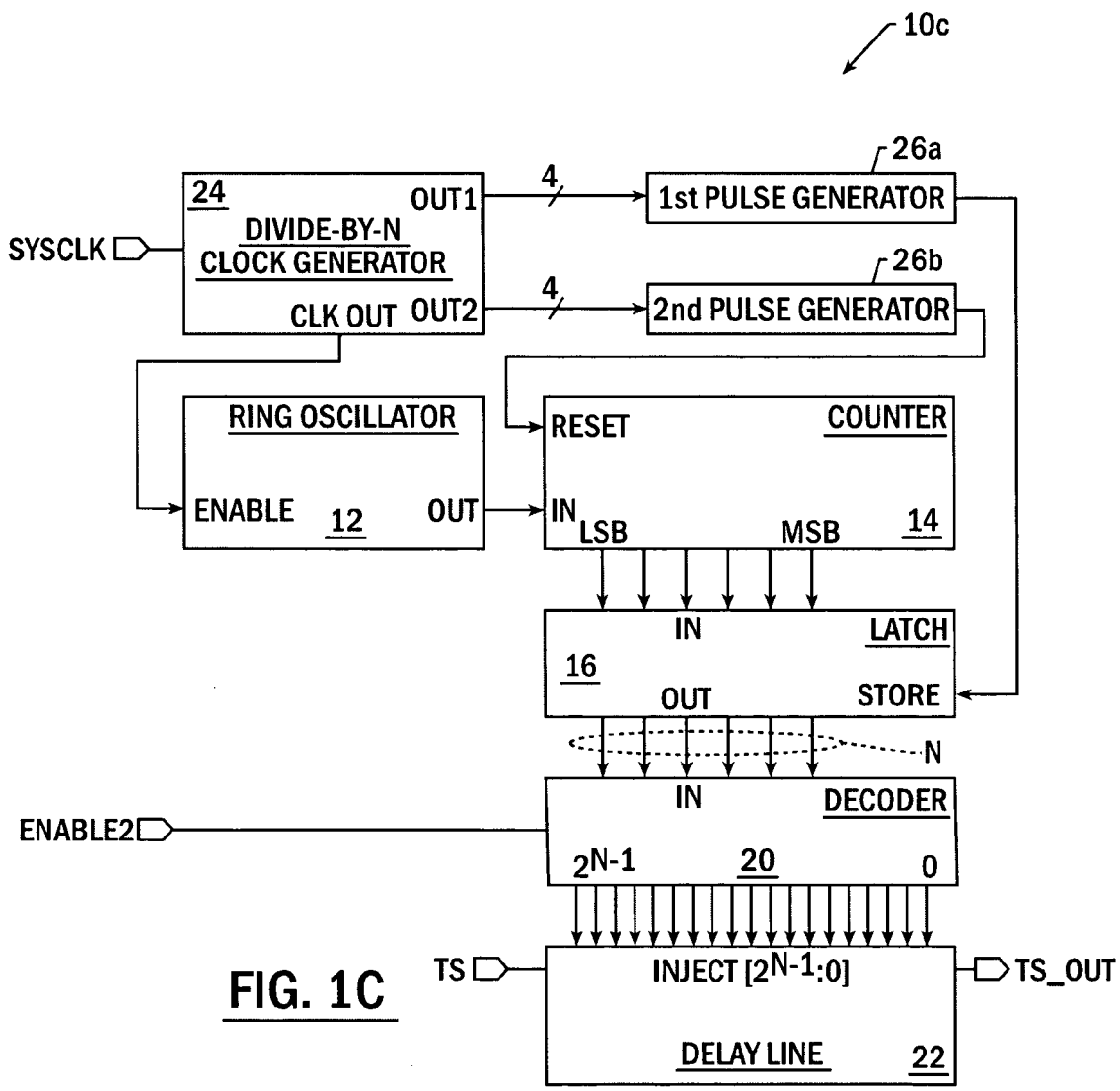
FIG. 1C is a block diagram of an integrated circuit delay device according to third embodiments of the present invention.

Referring now to FIG. 1C, an integrated circuit delay device 10c according to a third embodiment of the present invention will be described. The delay device 10c of FIG. 1C is otherwise identical to the delay device 10b of FIG. 1B, however, the second latch 18 has been eliminated from the delay line control circuit (i.e., from between the first latch 16 and the decoder 20). Accordingly, in the delay device 10c of FIG. 1C, each automatic transfer of a count value from the counter 14 to the first latch 16 will automatically translate into an update of the injection control signal INJECT whenever the decoder 20 is enabled. This automatic update of the injection control signal INJECT will translate into an update in the location of the active injection port in the digital delay line 22 and a concomitant update in the delay provided by the digital delay line 22. This embodiment of FIG. 1C is typically less preferred than the embodiment of FIG. 1B, particularly in applications where the count value of the counter 14 is being updated frequently.

Figure 1D:
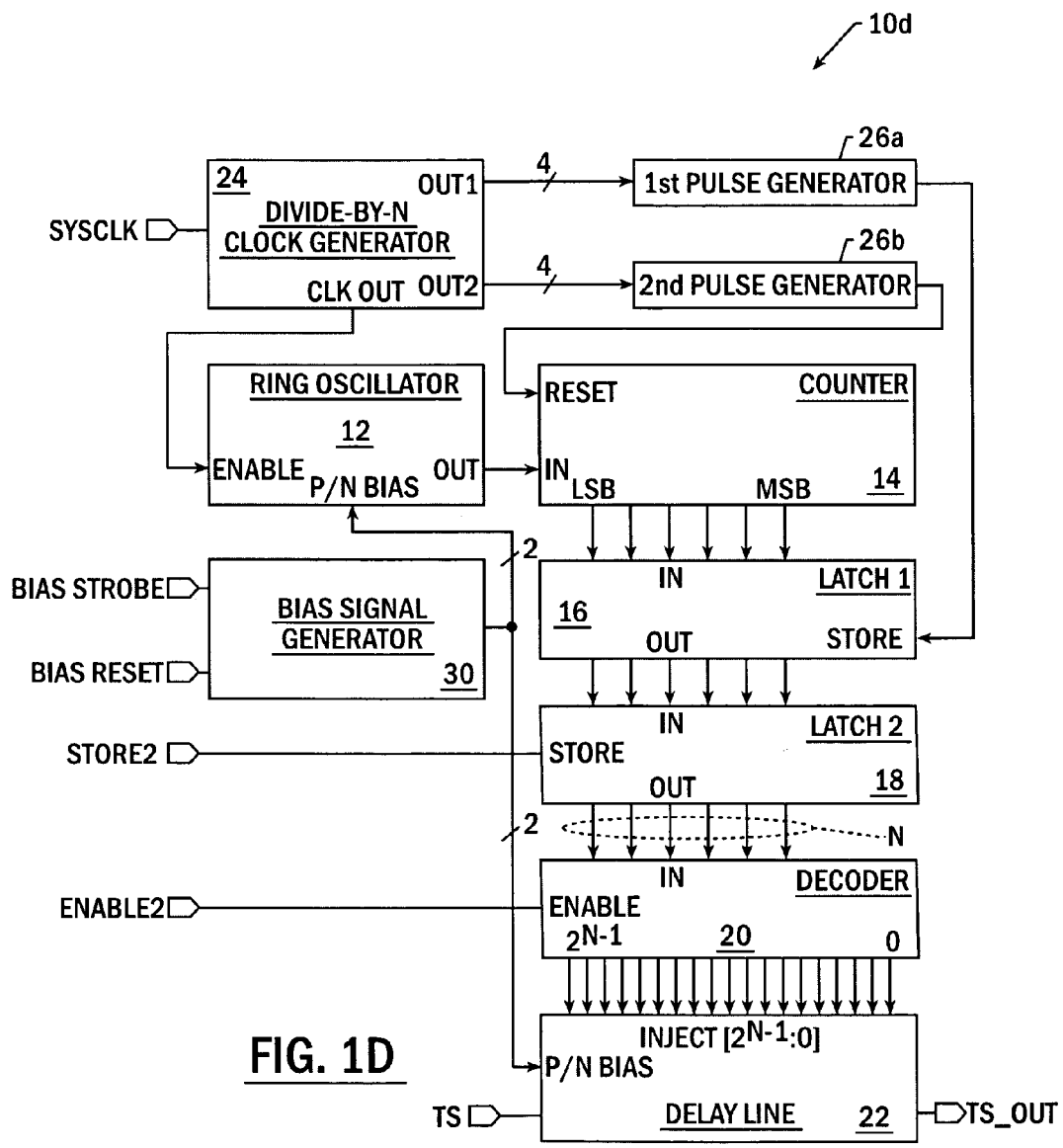
FIG. 1D is a block diagram of an integrated circuit delay device according to fourth embodiments of the present invention.

Referring now to FIG. 1D, an integrated circuit delay device 10d according to a fourth embodiment of the present invention will be described. This delay device 10d is similar to the delay device 10b of FIG. 1B, however, a bias signal generator 30 is provided to improve the performance characteristics of the delay device 10d by making the delay provided by the digital delay line 22 less susceptible to power supply noise and/or sustained voltage level shifts on a power supply line that is electrically coupled to the delay device 10d. As illustrated, the bias signal generator 30 is responsive to two control signals. These two control signals include a bias strobe signal BIAS STROBE and a bias reset signal BIAS RESET. In response to these control signals, the bias signal generator 30 supplies the ring oscillator 12 and the digital delay line 22 with a pair of bias signals. These bias signals are illustrated as a PBIAS signal and an NBIAS signal. The ability of these bias signals to facilitate an improvement in the power supply noise characteristics of the ring oscillator 12 and the digital delay line 22 is described more fully hereinbelow with respect to FIGS. 4A–4C, 7 and 9–10.

Figures 2, 2A:
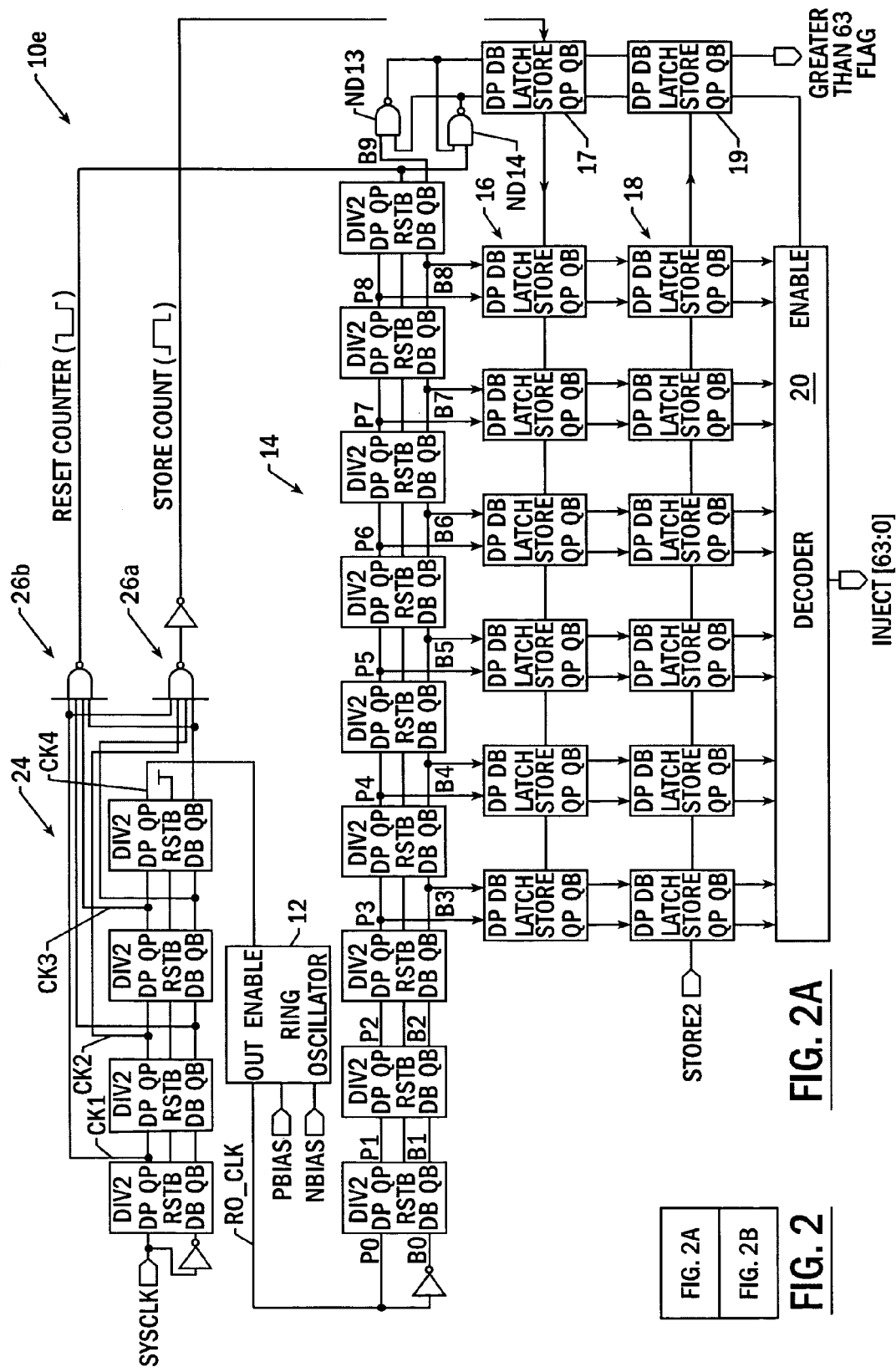
FIG. 2 is a detailed electrical schematic of an integrated circuit delay device according to further embodiments of the present invention.
Figure 5:
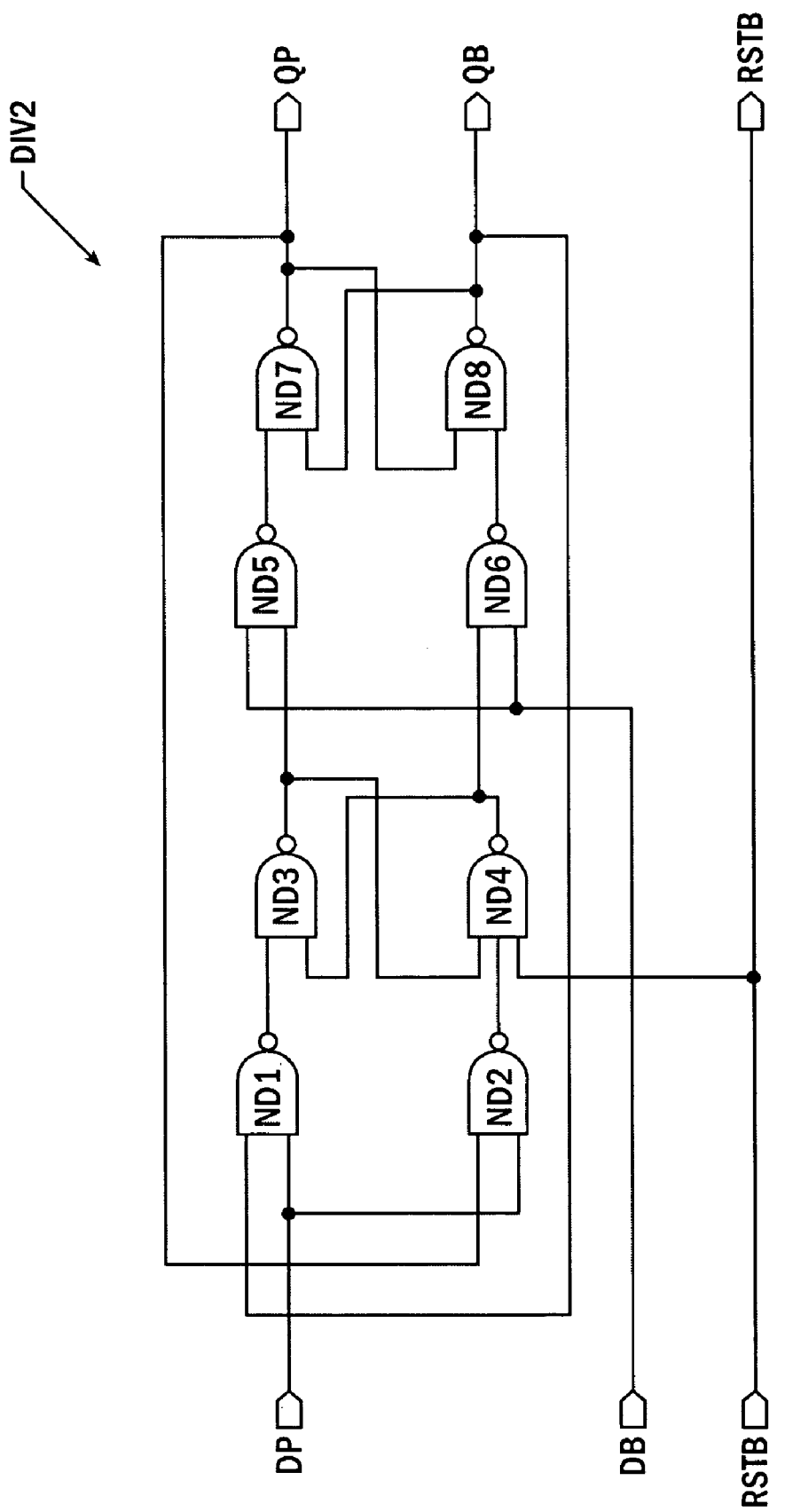
FIG. 5 is an electrical schematic of a divide-by-two latch element (DIV2) that may be used in the delay device of FIG. 2.

A detailed electrical schematic of an integrated circuit delay device 10e according to a further embodiment of the present invention is illustrated by FIG. 2. This delay device 10e includes a four-stage divide-by-N clock generator 24 that is responsive to a system clock signal, shown as SYSCLK. This system clock signal may be a highly accurate clock signal that is generated by a delay locked loop (not shown). Each stage of the clock generator 24 is illustrated as including a divide-by-two latch element, shown as DIV2, that generates true and complementary output signals QP and QB, respectively. Each of these latch elements DIV2 is responsive to a pair of input signals DP and DB and an active low reset signal RSTB. A preferred embodiment of each latch element DIV2 is illustrated in detail by FIG. 5. In FIG. 5, the latch element DIV2 includes a master stage formed by four NAND gates, shown as ND1–ND4, and a slave stage formed by four NAND gates, shown as ND5–ND8. In the illustrated clock generator 24, the reset input RSTB of the latch elements is held at an inactive high level. Accordingly, the clock generator 24 runs continuously in response to the system clock signal SYSCLK. The illustrated latch elements DIV2 are of conventional design and need not be described more fully herein.

The illustrated clock generator 24 generates four clock signals, shown as CK1–CK4. The timing of these signals is illustrated more fully by FIG. 11, where a system clock signal SYSCLK having a period of 10 ns is provided as an example. The clock signals CK1, CK2, CK3 and CK4 have periods that are two times, four times, eight times and sixteen times the period of the system clock signal SYSCLK, respectively.

Figure 11:
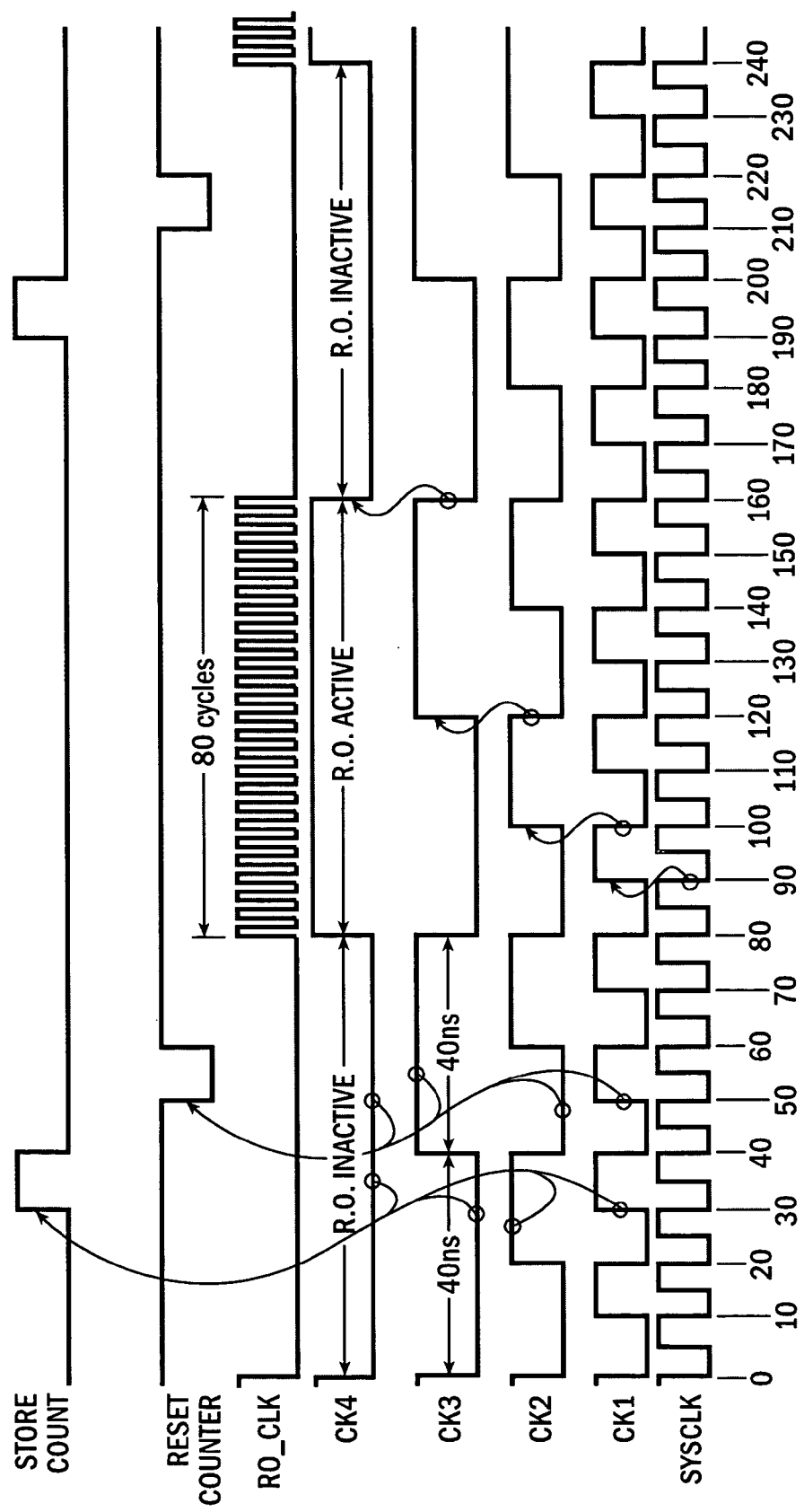
FIG. 11 is a timing diagram that illustrates the timing of signals generated within the delay device of FIG. 2.

The delay device 10e of FIG. 2 also includes a first pulse generator 26a and a second pulse generator 26b. As illustrated, the first pulse generator 26a is formed by a first 4-input NAND gate and an inverter that is electrically coupled to the output of the first 4-input NAND gate. As illustrated by FIG. 11, the first pulse generator 26a generates an active high pulse, shown as STORE COUNT, whenever the following combination of clock signals is present: {CK1=1, CK2=1, CK3=0 and CK4=0}. The second pulse generator 26b, which is formed by a second 4-input NAND gate, generates an active low pulse, shown as RESET COUNTER, whenever the following combination of clock signals is present: {CK1=1, CK2=0, CK3=1 and CK4=0}. Based on the configuration of the first and second pulse generators 26a and 26b, each leading edge of a STORE COUNT pulse precedes a respective leading edge of a RESET COUNTER pulse.

The clock signal CK4 is provided to an enable input of a ring oscillator 12. Detailed electrical schematics of a ring oscillator 12 according to a preferred aspect of the present invention are provided by FIGS. 3 and 9, where the clock signal CK4 operates as the ring oscillator enable signal RO_ENABLE and the output OUT of the ring oscillator 12 is defined as RO_CLK. As illustrated by the timing diagram of FIG. 11, the clock signal RO_CLK represents a high frequency clock signal that is active whenever the clock signal CK4 is generated at an active level (e.g., CK4=1). As described more fully hereinbelow with respect to FIGS. 3 and 9, the ring oscillator 12 is responsive to a pair of bias signals that operate to improve the performance characteristics of the ring oscillator 12. These bias signals (PBIAS, NBIAS) are generated by the bias signal generator 30.

The counter 14 in the delay device 10e of FIG. 2A is illustrated as including a cascaded string of nine (9) divide-by-two latch elements, shown as DIV2. These latch elements may be configured as illustrated by FIG. 5. The counter 14 has an input that is responsive to the ring oscillator clock signal RO_CLK and a plurality of outputs B3–B8 and P3–P8 that generate a count value. The outputs B3 and P3 represent the least significant bits of the count value and the outputs B8 and P8 represent the most significant bits of the count value. The outputs B1–B2 and P1–P2 of the first two latch elements are illustrated as not contributing to the least significant bits of the count value. The ninth latch element is utilized to indicate whether the count value has exceeded a threshold value. This threshold value is illustrated as being equal to 63, which is the maximum count value that can be processed in the illustrated embodiments. In particular, when the output B9 of the last latch element first transitions from 1→0 to thereby represent a count value that exceeds 63, the output of NAND gate ND13 will transition from 0→1 and the output of NAND gate ND14 will transition from 1→0 and be held at a logic 0 level while the output of the second pulse generator 26b is inactive (i.e., RESET COUNTER=1).

In response to the count value exceeding 63, the latch element 17 will generate a pair of output signals QB=1 and QP=0 in-sync with the receipt of an active high pulse generated by the first pulse generator 26a (i.e., STORE COUNT=1). This latch element 17 is located at the same level as the first multi-bit wide latch 16. An exemplary embodiment of a latch element LATCH, which includes four NAND gates ND9–ND12, is more fully illustrated by FIG. 6. The output signals generated by the latch element 17 are passed to the latch element 19, which is located at the same level as the second multi-bit wide latch 18. The latch element 19 is responsive to an active high second store signal, shown as STORE2, which may be generated external to the delay device 10e. Accordingly, if a count value exceeding sixty three (63) is detected by the last stage of the counter 14 while the ring oscillator 12 is active, then the generation of an active high pulse by the first pulse generator 26a will cause the inputs DB and DP of the latch element 19 to be set to the following values: DB=1 and DP=0. Then, in response to the occurrence of an active high second store signal STORE2 before the generation of a next active high pulse by the first pulse generator 26a, these signals at the inputs DB and DP will be passed to the outputs of the latch element 19 so that QB=1 and QP=0. These outputs of the latch element 19 will operate to: (i) disable the decoder 20, which occurs upon receipt of a low enable signal (i.e., QP=0=ENABLE); and (ii) generate an active high flag signal, which indicates that a count value exceeding 63 has occurred. The occurrence of an excessive count value represents a condition whereby the period of the system clock signal SYSCLK has become excessive and the digital delay line 22 is incapable of providing a sufficiently long percent-of-clock period delay to accommodate the longer system clock period.

Figure 6:
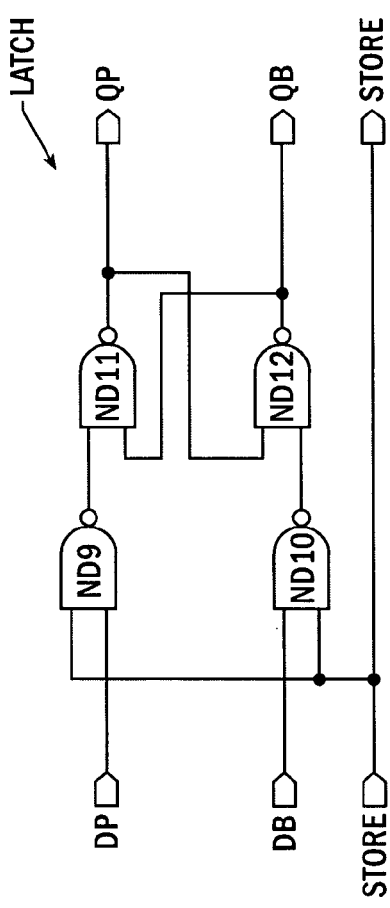
FIG. 6 is an electrical schematic of a latch element (LATCH) that may be used in the delay device of FIG. 2.

The first multi-bit wide latch 16 is illustrated as including an upper tier of six (6) latch elements that receive six pairs of complementary signals (P3, B3) to (P8, B8) from the counter 14. These six pair of complementary signals represent a 6-bit count value. The latch elements, which may be identical to the latch element of FIG. 6, are responsive to the active high pulses generated by the first pulse generator 26a. The second multi-bit wide latch 18 is illustrated as including a lower tier of six (6) latch elements that receive and latch the count value held by the first latch 16, in response to a second store signal STORE2. In contrast to the pulses that are continuously generated by the first pulse generator 26a during each time interval when the ring oscillator 12 is inactive, the second store signal STORE2 is preferably generated by control circuitry external to the delay device 10e. The frequency at which the second store signal STORE2 is generated is typically substantially less than the frequency of the pulses generated by the first pulse generator 26a. Moreover, the second store signal STORE2 is preferably only generated when the digital delay line 22 (see, e.g., FIGS. 1B and 2B) is inactive and a change in a location of an active injection port within the digital delay line 22 can be achieved without causing an erroneous generation of a delayed timing signal TS_OUT.

The second latch 18 provides the selected count value to inputs of the decoder 20. In response, the decoder 20 generates a multi-bit injection control signal INJECT[$2^{N-1}$:0]. When enabled, the decoder 20 may generate one of 64 different injection control signals in a range between: INJECT[63:0]=[0111 . . . 111] and INJECT[63:0]= [1111 . . . 110], as highlighted above. However, when disabled, the decoder 20 may generate an injection control signal INJECT that precludes any injection port within the digital delay line 22 from being active to receive the timing signal TS. In this case, the injection control signal INJECT [63:0]=[1111 . . . 111].

Figure 2B:
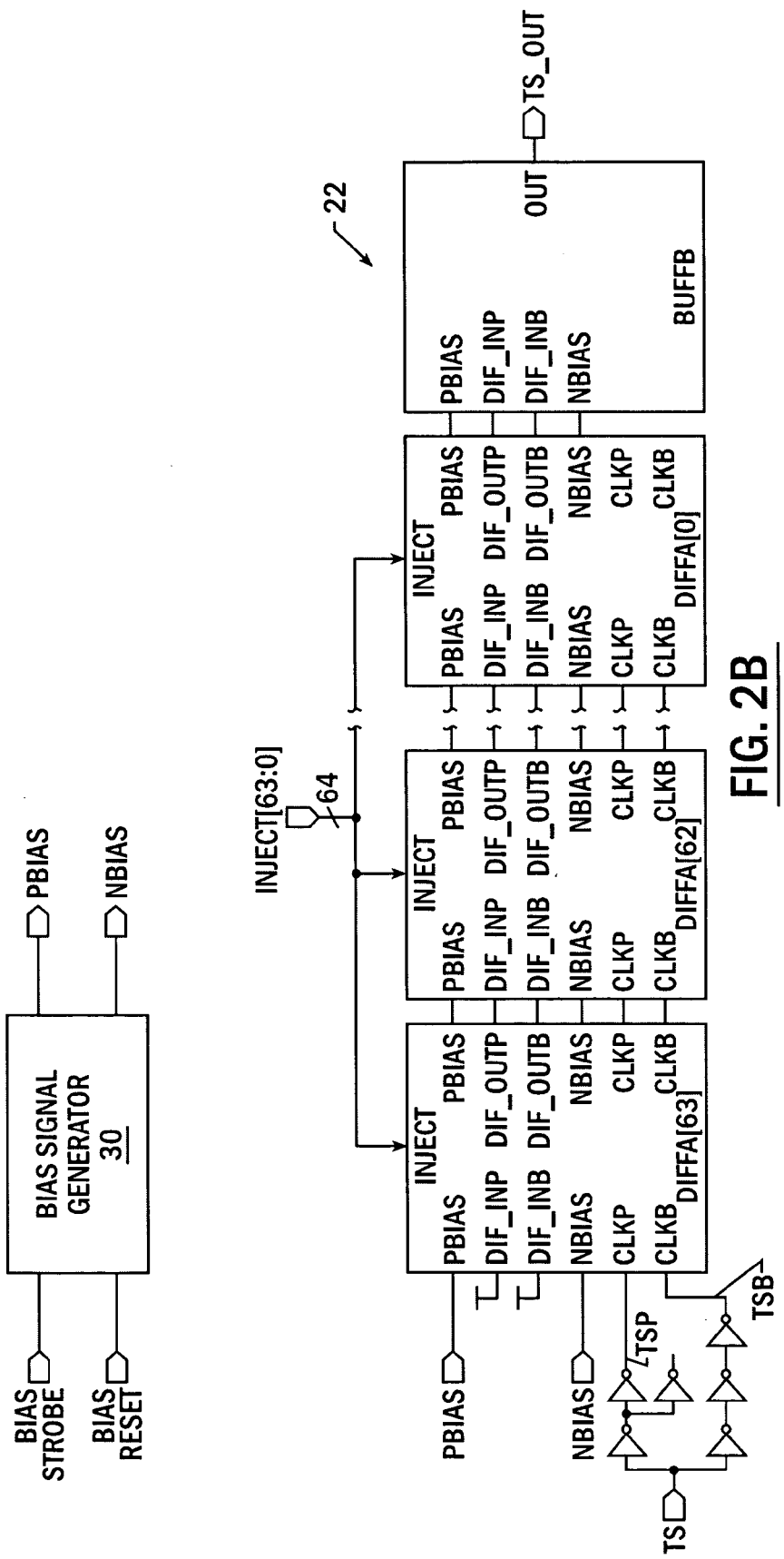
Figure 8:
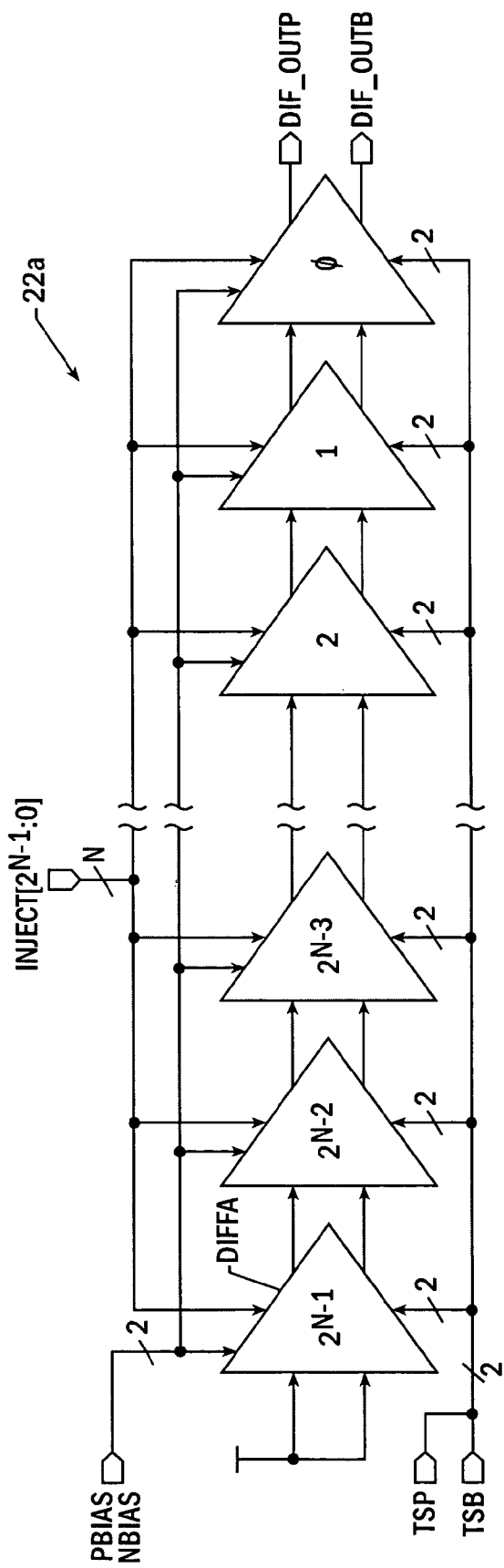
FIG. 8 is an electrical schematic of a digital delay line according to some embodiments of the present invention.
Figure 9:
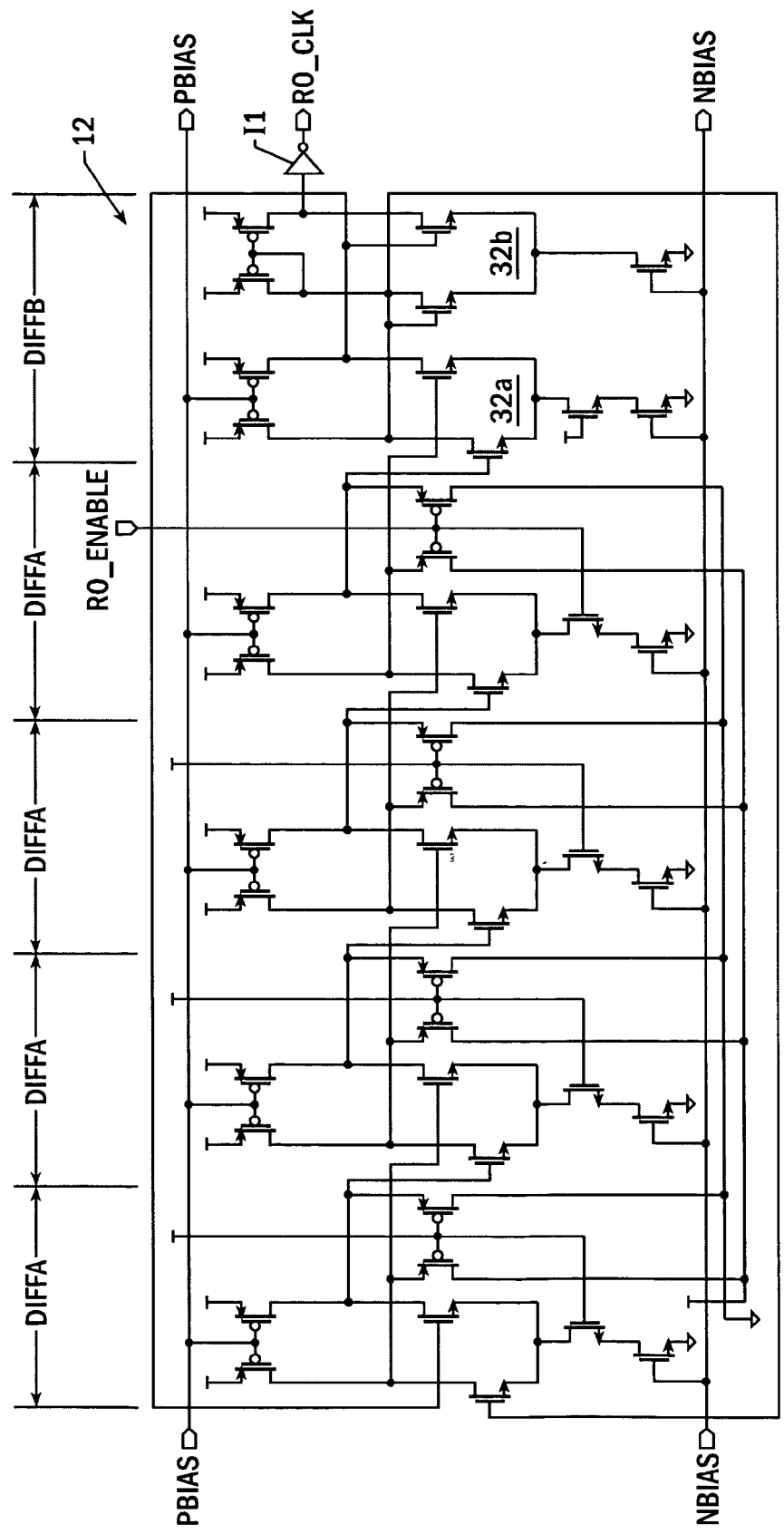
FIG. 9 is a detailed electrical schematic of a ring oscillator according to some embodiments of the present invention.
Figure 10:
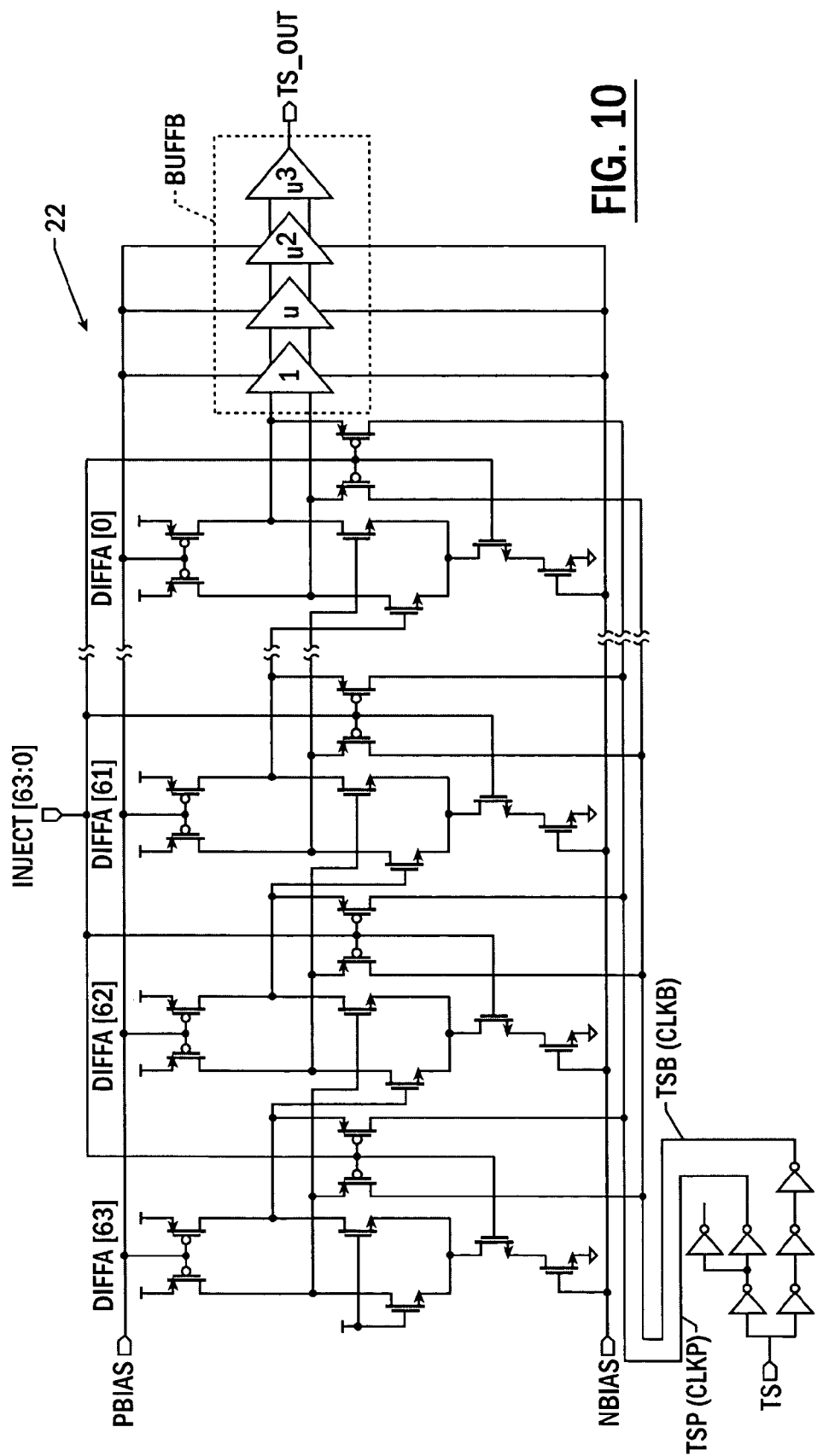
FIG. 10 is a detailed electrical schematic of a digital delay line that may be used in the delay device of FIGS. 1A–1D and 2.

As illustrated in detail by FIGS. 2B, 8 and 10, the digital delay line 22 may include a cascaded string of delay elements 22a. The delay line 22 may also be configured to include an output buffer stage that is electrically coupled to the last delay element in the cascaded string. Alternatively, the output buffer stage may be treated as a separate device in the path of a differential timing signal that is produced at the outputs of the last delay element in the string 22a.

In the illustrated embodiment, the cascaded string of delay elements 22a includes 64 differential amplifier delay elements (DIFFA) and one output buffer (BUFFB). Each of the 64 differential amplifier delay elements DIFFA[63]-DIFFA[0] illustrated by FIGS. 8 and 10 are preferably configured in accordance with FIG. 4A and the output buffer BUFFB is preferably configured in accordance with FIG. 4C. The input timing signal TS is split into a pair of differential timing signals TSP and TSB using a plurality of inverters that are configured to insure that the leading and trailing edges of the differential timing signals TSP and TSB are aligned. The pair of timing signals TSP and TSB will also be referred to collectively herein as a "timing signal."

Figure 4A:
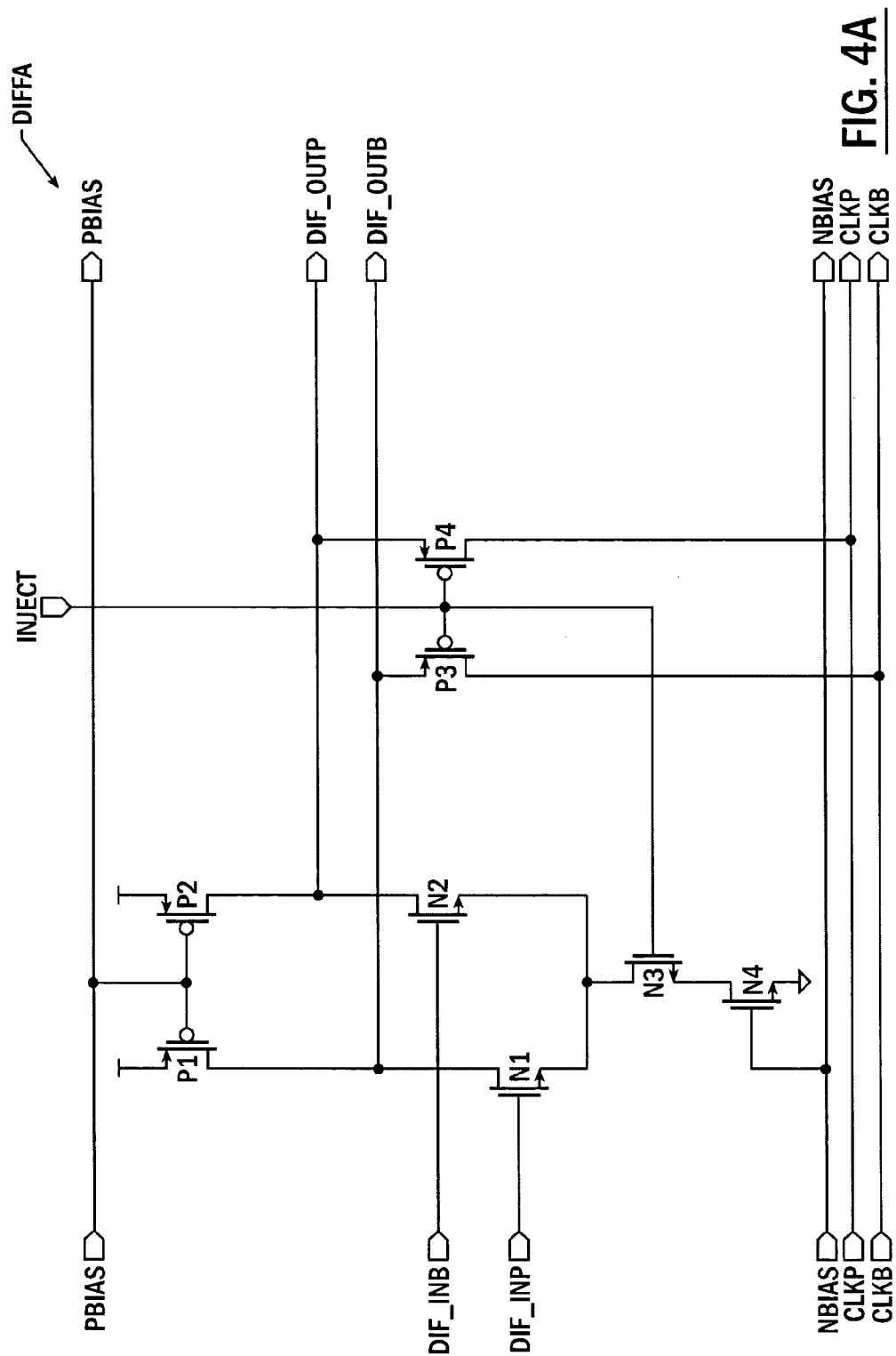
FIG. 4A is an electrical schematic of a differential amplifier delay element having a dual-terminal injection port (DIFFA), which may be used in the delay device and ring oscillator embodiments of FIGS. 1–3.

As illustrated in detail by FIG. 4A, each differential amplifier delay element DIFFA includes a pair of NMOS input transistors N1 and N2 having gate electrodes that receive a pair of differential input signals, shown as DIF_INP and DIF_INB. The source terminals of the input transistors N1 and N2, which are current carrying terminals, are electrically coupled together. The delay element DIFFA also includes a current source connected to the source terminals of each of the input transistors. The current source includes a pair of NMOS transistors, shown as N3 and N4. These NMOS transistors N3 and N4 are electrically connected in series in a totem pole arrangement that extends between the source terminals of the input transistors N1 and N2 and a reference signal line (e.g., GND). The gate of the NMOS transistor N3 is responsive to a respective bit of the multi-bit injection control signal INJECT. The gate of the NMOS transistor N4 is electrically coupled to a second bias signal line, which receives a second bias signal NBIAS thereon. A pair of PMOS load transistors P1 and P2 are also provided. The drain terminals of the PMOS load transistors P1 and P2 are electrically coupled to the differential outputs of the delay element DIFFA. These differential outputs are shown as DIF_OUTP and DIF_OUTB. In particular, the drain terminal of PMOS load transistor P1 is electrically connected to the drain terminal of NMOS input transistor N1 and the complementary output DIF_OUTB of the delay element. The drain terminal of PMOS load transistor P2 is electrically connected to the drain terminal of NMOS input transistor N2 and the true output DIF_OUTP of the delay element. The gates of PMOS load transistors P1 and P2 are electrically coupled to a first bias signal line, which receives a first bias signal PBIAS thereon. As described more fully hereinbelow, improved power supply noise immunity can be achieved by floating the first and second bias signal lines PBIAS and NBIAS at first and second voltage levels when the differential delay element DIFFA is active.

The illustrated differential delay element DIFFA of FIG. 4A also includes an injection port that can be enabled to accept an input timing signal, shown as differential timing signals CLKP (TSP) and CLKB (TSB). The injection port is defined by a pair of PMOS transistors P3 and P4. The drain terminals of the PMOS injection transistors P3 and P4 represent true and complementary injection terminals within a respective pair of differential injection terminals associated with the injection port. The gates of the PMOS injection transistors P3 and P4 are responsive to a respective bit of the multi-bit injection control signal INJECT. When the respective bit of the injection control signal INJECT is set to a logic 0 level, the injection port will be active to accept and pass a timing signal to the differential outputs DIF_OUTP and DIF_OUTB and NMOS transistor N3 within the current source will be turned off to thereby disable the pair of NMOS input transistors N1 and N2.

Figure 4B:
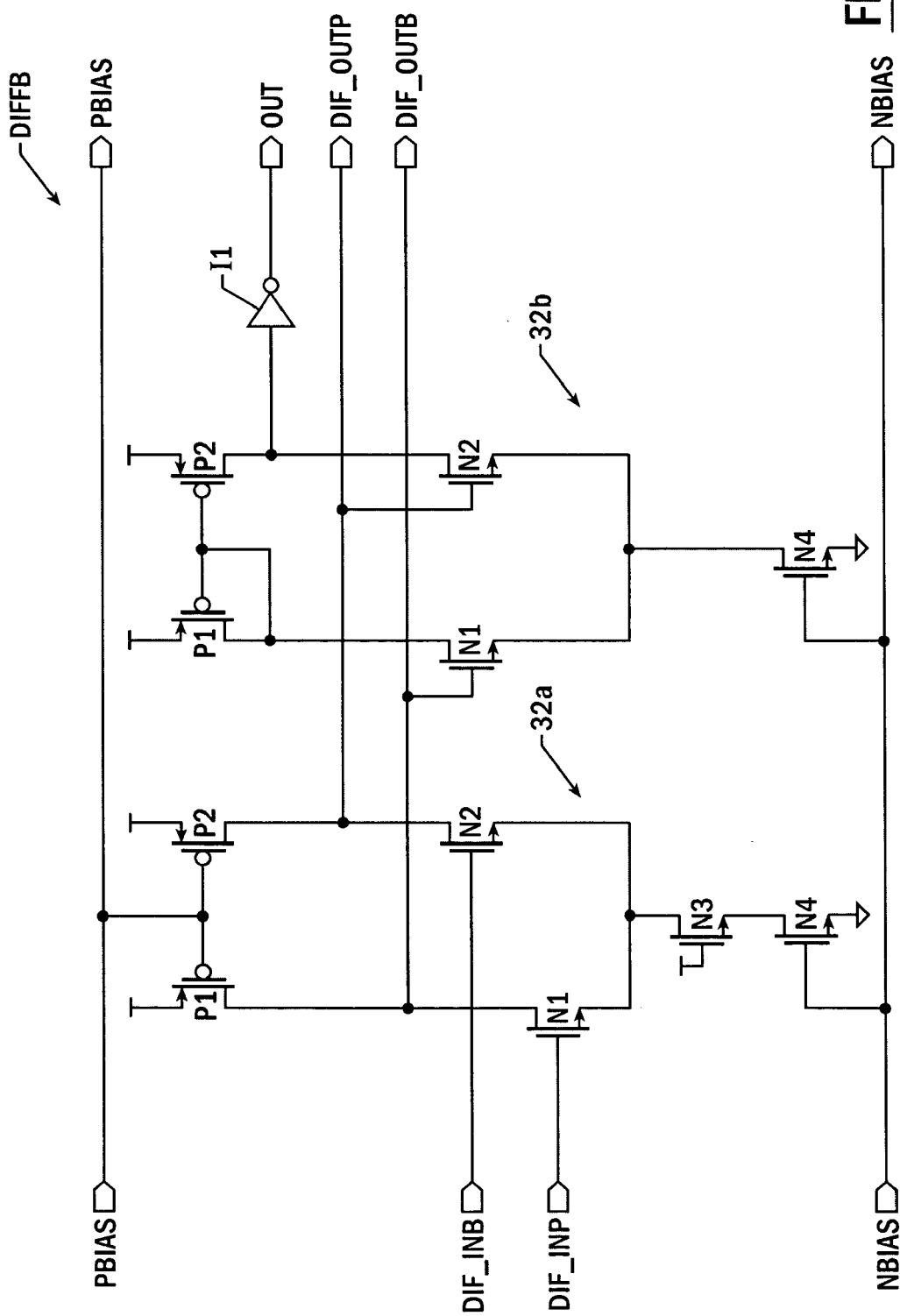
FIG. 4B is an electrical schematic of a differential amplifier delay element that may be used as an output stage (DIFFB) of the ring oscillator of FIG. 3.
Figure 4C:
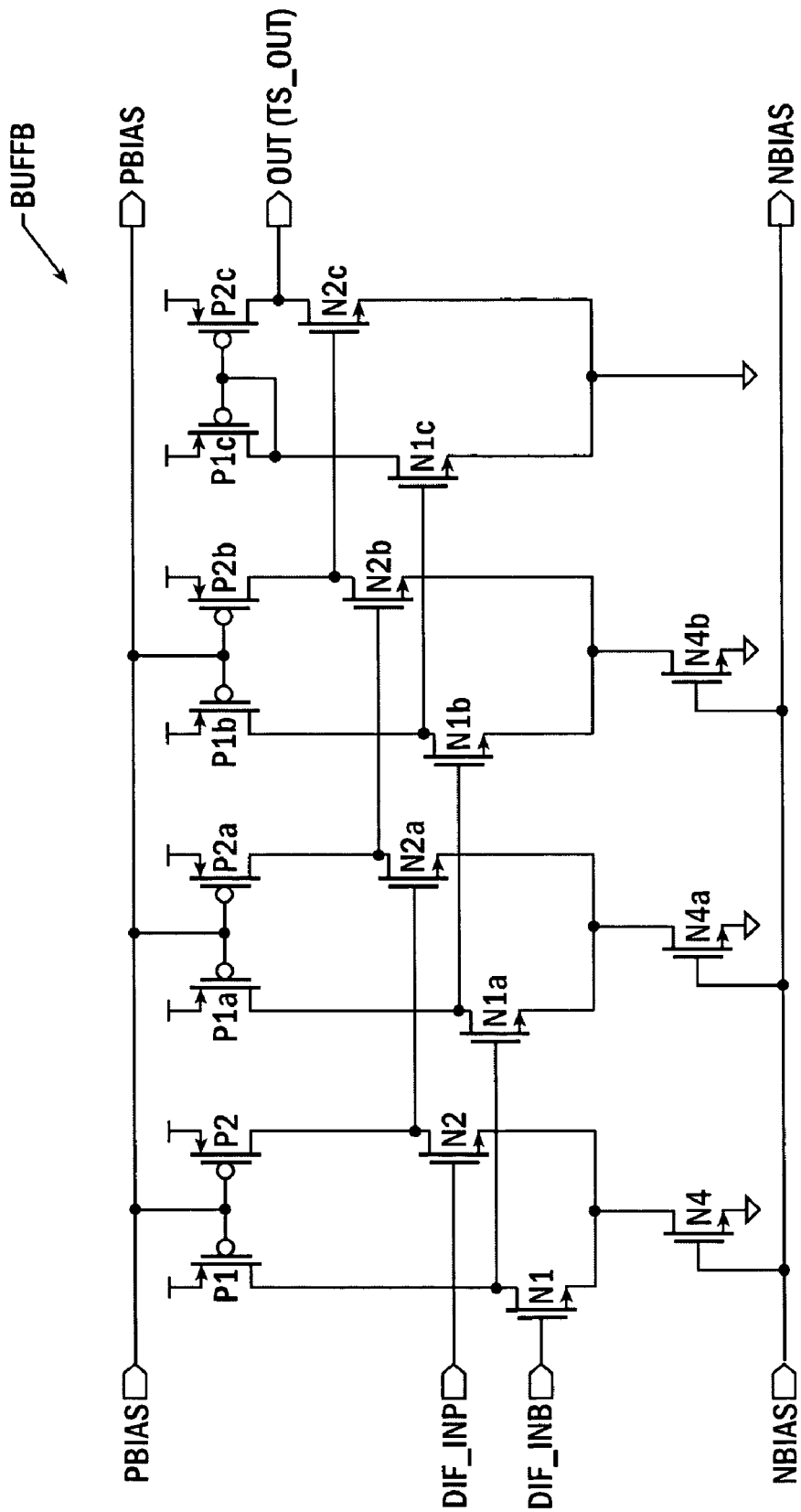
FIG. 4C is an electrical schematic of a differential signal buffer that may be used as a signal buffer (BUFFB) in the digital delay line of FIG. 2.

Referring now to FIG. 4C, the output buffer BUFFB, which may be connected to the last differential amplifier delay element in the cascaded string, shown as DIFFA[0] in FIG. 10, is illustrated as including four differential amplifier stages. These four additional stages may add a nominal delay to the differential output signal generated by the last delay element DIFFA[0] in the string. However, as described more fully with respect to FIG. 12, this additional delay may be balanced with delays added to a received data signal (e.g., read data signal). The first stage includes a pair of NMOS input transistors, shown as N1 and N2, and a pair of PMOS load transistors P1 and P2. A current source, provided by NMOS transistor N4, is also provided. The gates of the PMOS load transistors P1 and P2 are electrically connected to the first bias signal line PBIAS and the gate of NMOS transistor N4 is electrically connected to the second bias signal line NBIAS. The second, third and fourth stages of the output buffer BUFFB are similar to the first stage, but may be sized with larger transistors to provide an improved propagation delay. This scaling in size is designated by the scaling factor "u" shown within the stages of the output buffer BUFFB of FIG. 10. The use of multiple buffer stages of different size to obtain improved propagation delay characteristics is more fully illustrated and described at section 8.2 of a textbook by J. M. Rabaey, entitled Digital Integrated Circuits: A Design Perspective, Prentice Hall Electronics and VSLI Series (1996).

According to a preferred aspect of the digital delay line 22 illustrated by FIGS. 2B, 8 and 10, each of the active differential delay elements DIFFA that extend between an enabled injection port and the input of the output buffer BUFFB have equivalent delay characteristics. Moreover, because the active length of the digital delay line 22 is measured between the enabled injection port and the output of the last delay element in the cascaded string, the delay provided by each delay element can be kept small because none of the delay elements need to be designed to drive more than the loading provided by the next active delay element (or the loading associated with the first stage of the output buffer BUFFB, which matches the loading of an active delay element). This feature improves the resolution of the digital delay line 22. The injection port associated with each delay element also provides relatively little source terminal loading to the differential outputs of the respective delay element.

Figure 3:
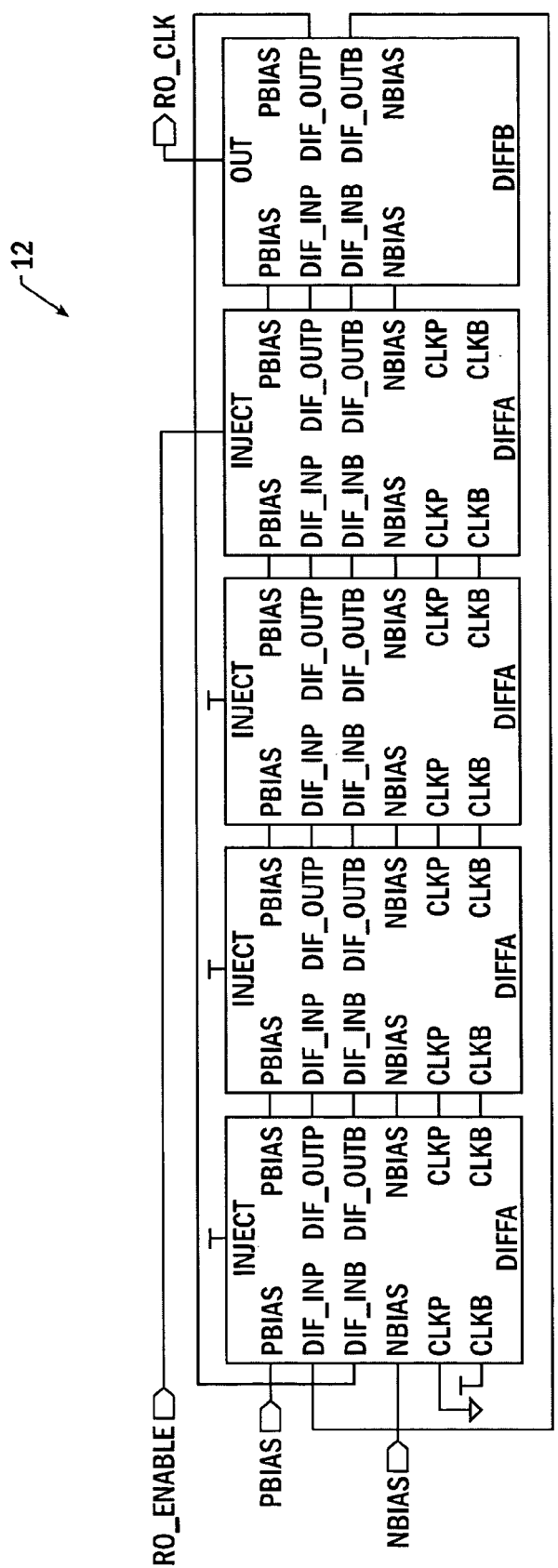
FIG. 3 is an electrical schematic of a ring oscillator according to some embodiments of the present invention.

The ring oscillator 12 of FIG. 2 will now be more fully described with reference to FIGS. 3, 4A–4B and 9'. In particular, FIG. 3 illustrates a 5-stage ring oscillator 12 having four differential amplifier delay elements DIFFA, which match the delay elements DIFFA of the digital delay line 22, and one differential amplifier delay element DIFFB that includes two differential amplifiers 32a and 32b. As illustrated by FIG. 4B, the first differential amplifier 32a includes a pair of differential outputs, DIF_OUTP and DIF_OUTB, that are cross-coupled and fed back to the inputs of the first differential amplifier delay element in the ring oscillator 12. These differential outputs of the first differential amplifier 32a also drive inputs of the second differential amplifier 32b. The loading associated with the gates of the NMOS input transistors N1 and N2 in the second differential amplifier 32b and the wiring required to feed back the differential outputs DIF_OUTP and DIF_OUTB of the first differential amplifier 32a to the inputs of the first differential amplifier delay element in the ring oscillator 12, may be designed to be about equal to the loading that would otherwise be provided by the source terminals of a dual-terminal injection port associated with a differential amplifier delay element DIFFA. An inverter 11, which has an input that is electrically coupled to an output of the second differential amplifier 32b, is provided for generating the ring oscillator clock signal RO_CLK. As illustrated best by FIGS. 3 and 9, the ring oscillator 12 is enabled when the ring oscillator enable signal RO_ENABLE, which is represented by clock signal CK4 in FIG. 2, is set to a logic 1 level. When the ring oscillator enable signal RO_ENABLE is set high to a logic 1 level, the injection port that receives the ring oscillator enable signal RO_ENABLE will become disabled. When this occurs, the delay elements DIFFA and DIFFB within the ring oscillator 12 will be enabled to propagate a ring oscillator clock signal having a period that equals twice the sum of the delays provided by each of the five delay elements therein.

A preferred embodiment of the bias signal generator 30 illustrated by FIGS. 1D and 2B will now be described with reference to FIG. 7. The bias signal generator 30 of FIG. 7 includes a first bias signal generator 30a that generates a first bias signal, shown as PBIAS, and a second bias signal generator 30b that generates a second bias signal, shown as NBIAS. The first bias signal generator 30a is illustrated as including a PBIAS control circuit 40a and a first pair of switches, shown as SWITCH A and SWITCH B. The first pair of switches have control terminals that are electrically connected to a pair of outputs of the PBIAS control circuit 40a, shown as outputs A and B. Each of the first pair of switches is also illustrated as including a respective pair of current carrying terminals. These current carrying terminals may constitute the source and drain terminals of a respective MOS transistor or opposite current carrying terminals of a CMOS transmission gate, for example. A pull-up capacitor $C_P$ is also provided. The pull-up capacitor $C_P$ has one electrode connected to a positive power supply line (e.g., Vdd) and another electrode connected at an intermediate node P to a current carrying terminal of SWITCH A and a current carrying terminal of SWITCH B, as illustrated. The PBIAS control circuit 40a is also responsive to a bias strobe signal BIAS STROBE and a bias reset signal BIAS RESET.

The second bias signal generator 30b is illustrated as including a NBIAS control circuit 40b and a second pair of switches, shown as SWITCH C and SWITCH D. The NBIAS control circuit 40b is responsive to the bias strobe signal BIAS STROBE and the bias reset signal BIAS RESET. The second bias signal generator 30b also includes a voltage divider 42 that generates a reference voltage at an output thereof, shown as NREF. The voltage at the output NREF may be about equal to a threshold voltage of the NMOS transistor within the voltage divider 42. The threshold voltage of the illustrated NMOS transistor within the voltage divider 42 may be equal to about 0.6 volts, for example. The second pair of switches have control terminals that are electrically connected to a pair of outputs of the NBIAS control circuit 40b, shown as outputs C and D. Each of the second pair of switches is also illustrated as including a respective pair of current carrying terminals. Each pair of current carrying terminals may constitute source and drain terminals of a respective MOS transistor or opposite current carrying terminals of a CMOS transmission gate. A pull-down capacitor $C_N$ is also provided. The pull-down capacitor $C_N$ has one electrode connected to a reference signal line (e.g., Vss) and another electrode connected at an intermediate node N to a current carrying terminal of SWITCH C and a current carrying terminal of SWITCH D.

The bias strobe signal BIAS STROBE may be a periodic clock signal having leading and trailing edges that occur at regular intervals. The PBIAS control circuit 40a and the NBIAS control circuit 40b may be configured to turn on SWITCH A and SWITCH C and turn off SWITCH B and SWITCH D in response to a leading edge of the bias strobe signal BIAS STROBE. The PBIAS control circuit 40a and the NBIAS control circuit 40b may also be configured to turn on SWITCH B and SWITCH D and turn off SWITCH A and SWITCH C in response to a trailing edge of the bias strobe signal BIAS STROBE. During normal operation of the delay devices 10d and 10e of FIGS. 1D and 2, SWITCH A and SWITCH B are controlled to not turn on simultaneously and SWITCH C and SWITCH D are also controlled to not turn on simultaneously. Moreover, it is preferred practice to not pump signal lines PBIAS and NBIAS with displacement current when the delay line 22 and ring oscillator 12 are active.

The PBIAS control circuit 40a and the NBIAS control circuit 40b may be configured to respond to an active bias reset signal BIAS RESET. This reset signal may be an active high (or active low) signal. In particular, the PBIAS and NBIAS control circuits 40a and 40b may be configured so that upon receipt of an active bias reset signal BIAS RESET, all of the four switches SWITCH A to SWITCH D are turned simultaneously and the state of the bias strobe signal BIAS STROBE is ignored. The bias reset signal BIAS RESET is typically made active upon power-up of the delay devices 10d and 10e. When the switches SWITCH A and SWITCH B within the first bias signal generator 30a are turned on simultaneously, the first bias signal line, shown as PBIAS, is shorted to the reference signal line (e.g. Vss) and thereby completely discharged. Moreover, when the switches SWITCH D and SWITCH D within the second bias signal generator 30b are turned on simultaneously, the second bias signal line, shown as NBIAS, is shorted to the output of the voltage divider 42 and thereby set to a reference voltage that is about equal to a threshold voltage of an NMOS transistor.

In an alternative embodiment, the switches SWITCHA and SWITCHC may be replaced by a short circuit (and the pull-down capacitor $C_N$ and pull-up capacitor $C_P$ can be omitted). This embodiment may be advantageous in those applications where it is necessary to move the floating PBIAS signal line or floating NBIAS signal line over a greater range of voltages upon receipt of each BIAS STROBE signal.

Figure 7:
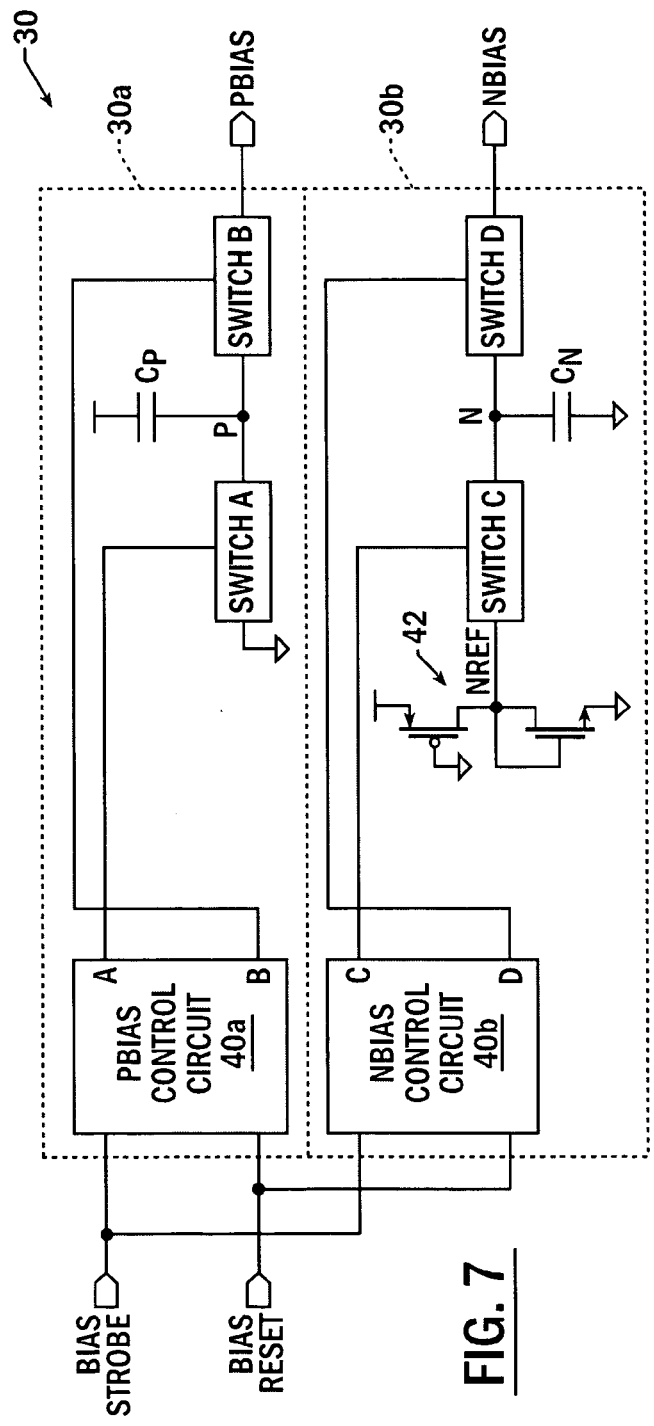
FIG. 7 is an electrical schematic of first and second bias signal generators according to embodiments of the present invention.

According to a preferred aspect of the illustrated bias signal generator 30 of FIG. 7, the capacitance of the pull-up capacitor $C_P$ is substantially less than a capacitance of the first bias signal line, shown as PBIAS, which is electrically coupled to the load transistors in the ring oscillator 12 and the digital delay line 22. In particular, the pull-up capacitor $C_P$ may be sized so that the capacitance of the first bias signal line PBIAS is greater than about 100 times the capacitance of the pull-up capacitor $C_P$. Similarly, the capacitance of the pull-down capacitor $C_N$ is substantially less than a capacitance of the second bias signal line, shown as NBIAS, which is electrically coupled to the current sources in the ring oscillator 12 and the digital delay line 22. In particular, the pull-down capacitor $C_N$ may be sized so that the capacitance of the second bias signal line NBIAS is greater than about 100 times the capacitance of the pull-down capacitor $C_N$.

Upon power-up of the delay devices 10d or 10e of FIGS. 1D and 2, the bias reset signal BIAS RESET is temporarily made active and the bias signal generator 30 operates to set the first bias signal line PBIAS to a voltage of the reference signal line, shown as Vss, and also set the second bias signal line to the voltage of the output NREF of the voltage divider 42. Thereafter, during normal operation, the bias signal generator 30 responds to each leading edge (e.g., rising edge) of the bias strobe signal BIAS STROBE by (i) turning off SWITCH B and SWITCH D and thereby floating the first and second bias signal lines PBIAS and NBIAS and (ii) turning on SWITCH A and SWITCH C to thereby short the intermediate node P to the reference signal line and short the intermediate node N to the output of the voltage divider 42. The bias signal generator 30 also responds to each trailing edge (e.g., falling edge) of the bias strobe signal BIAS STROBE by (i) turning off SWITCH A and SWITCH C and (ii) turning on SWITCH B and SWITCH D. The operation to turn on SWITCH B causes the intermediate node P to be shorted to the first bias signal line PBIAS. In this manner, the pull-up capacitor $C_P$ operates to drive the first bias signal line PBIAS with "positive" displacement current if $V_P > V_{PBIAS}$ or withdraw "negative" displacement current from the first bias signal line PBIAS if $V_P < V_{PBIAS}$, where $V_P$ designates the voltage of the intermediate node P and $V_{PBIAS}$ designates the voltage of the first bias signal line PBIAS. The amount of discrete charge transfer that is represented by the positive (or negative) displacement current for each turn-on cycle of SWITCH B is maintained at a relatively small value because of the design preference that $C_P \ll C_{PBIAS}$, where $C_{PBIAS}$ represents the total capacitance of the first bias signal line that spans the ring oscillator 12 and the digital delay line 22. Accordingly, the voltage of the first bias signal line PBIAS can be made to gradually track increases (or decreases) in the voltage of the power supply line Vdd.

Similarly, when SWITCH D is on, the pull-down capacitor $C_N$ will operate to drive the second bias signal line NBIAS with "positive" displacement current if $V_N > V_{NBIAS}$ or withdraw "negative" displacement current from the second bias signal line NBIAS if $V_N < V_{NBIAS}$, where $V_N$ designates the voltage of the intermediate node N and $V_{NBIAS}$ designates the voltage of the second bias signal line NBIAS. The amount of discrete charge transfer that is represented by the positive (or negative) displacement current for each turn-on cycle of SWITCH D is maintained at a relatively small value because of the design preference that $C_N \ll C_{NBIAS}$, where $C_{NBIAS}$ represents the total capacitance of the second bias signal line that spans the ring oscillator 12 and the digital delay line 22. Accordingly, the voltage of the second bias signal line NBIAS can be made to gradually track increases (or decreases) in the voltage of the reference signal line Vss.

In this manner, sustained positive (or negative) voltage level shifts in the power supply voltage Vdd will, in response to capacitive coupling provided by the pull-up capacitor $C_P$, gradually translate into higher (or lower) $V_P$ or $V_{PBIAS}$. Similarly, sustained positive (or negative) voltage level shifts in the voltage of the reference signal line Vss will, in response to capacitive coupling provided by the pull-down capacitor $C_N$, gradually translate into higher (or lower) $V_N$ or $V_{NBIAS}$.

Referring again to the preferred differential amplifier delay elements (DIFFA, DIFFB) of FIGS. 4A–4B and the differential amplifier buffer stages of FIG. 4C, the gradual upward (downward) changes in PBIAS with increasing (decreasing) Vdd will operate to sustain the gate-to-source voltages (Vgs) of PMOS load transistors P1 and P2 at constant values. These will translate into greater immunity between the delay characteristics of the illustrated delay elements and sustained changes in positive supply voltage. The floating of the first bias signal line PBIAS when SWITCH B is off will also support greater noise immunity between the positive power supply line and the gates of the PMOS load transistors P1 and P2.

Likewise, the gradual upward (downward) changes in NBIAS with increasing (decreasing) Vss will operate to sustain the gate-to-source voltage (Vgs) of NMOS pull-down transistor N4 (within the current source) at a constant value. This will also translate into greater immunity between the delay characteristics of the illustrated delay elements and sustained changes in the reference voltage. The floating of the second bias signal line NBIAS when SWITCH D is off will also support greater noise immunity between the reference line and the gate of the NMOS pull-down transistor N4 by maintaining a more constant Vgs.

Figure 12:
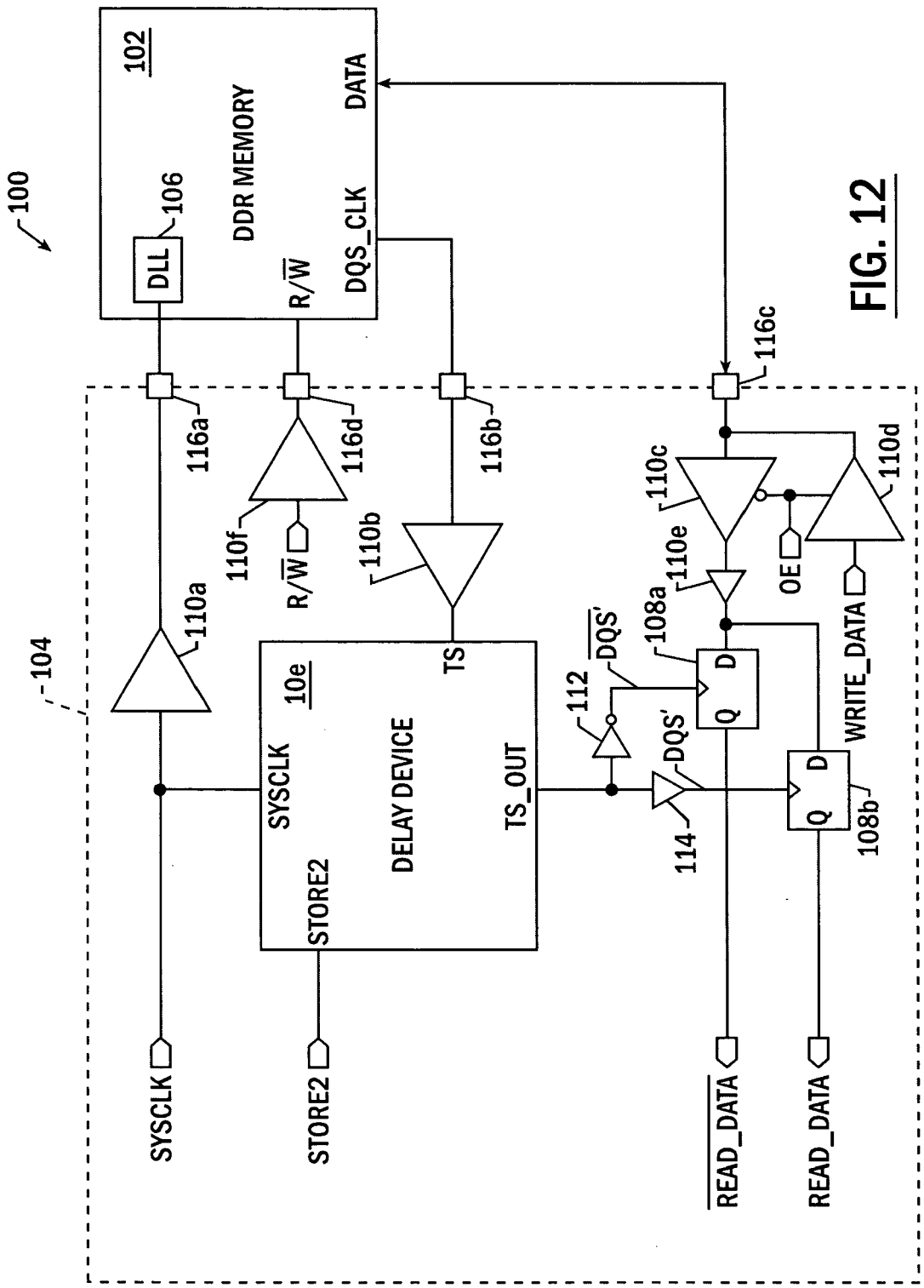
FIG. 12 is a block diagram of a multi-chip integrated circuit system having a dual data rate (DDR) memory chip and processor chip according to further embodiments of the present invention.

The integrated circuit delay devices described herein with respect to FIGS. 1–11 may be utilized in a multi-chip integrated circuit system operating at high frequency. As illustrated by FIG. 12, an exemplary multi-chip integrated circuit system 100 according to a further embodiment of the present invention includes a processor chip 104 and a memory chip 102 that communicate with each other through I/O pins 116a–116d. This processor chip 104 may be included in a DDR memory controller, for example. The memory chip 102 may be a dual data rate (DDR) memory chip in the illustrated embodiment. An exemplary DDR memory chip may include a DDR synchronous dynamic random access memory (SDRAM) device. Another exemplary DDR memory chip may include a DDR FIFO, which is more fully described in commonly assigned U.S. application Ser. No. 09/972,265, filed Oct. 5, 2001, entitled "FIFO Memory Devices Having Single Data Rate (SDR) and Dual Data Rate (DDR) Capability", the disclosure of which is hereby incorporated herein by reference. In some embodiments, the memory chip 102 includes a delay locked loop (DLL) 106 that receives a clock signal from the processor chip 104. The memory chip 102 is illustrated as receiving a read/write control signal (R/W) from a driver 110f on the processor chip 104 and also providing a strobe signal (DQS_CLK) and read data (DATA) to the processor chip 104. The data (DATA) may be provided on a bidirectional bus. The processor chip 104 includes a delay device 10e and a plurality of signal buffers 110a–110d, 110e and 114 and an inverter 112. In some embodiments, the delay device 10e may be configured as shown in FIGS. 1D and 2. The delay device 10e is illustrated as being responsive to a system clock signal SYSCLK, which is passed to the delay locked loop 106 within the memory chip 102, and a store signal STORE2. The strobe signal (DQS_CLK) is received at the timing signal input (TS) of the delay device 10e and is passed as a delayed signal to the output TS_OUT. The buffer 114 and inverter 112, which are responsive to the delayed timing signal, generate a pair of complementary strobe signals DQS' and /DQS' to a pair of latches 108a and 108b. The first and second latches 108a and 108b are configured to capture read data DATA received from the memory chip 102 and to generate a pair of complementary read data signals READ_DATA and /READ_DATA, which are synchronized with the complementary strobe signals DQS' and /DQS'. In some alternative embodiments, the delay device 10e may also include circuitry (e.g., delay tree circuitry) described more fully in U.S. application Ser. No. 10/094,101, to Cesar A. Talledo, filed Mar. 8, 2002, entitled "Apparatus and Method for Generating a Compensated Percent-of-Clock Period Delay Signal," the disclosure of which is hereby incorporated herein by reference. An output enable signal (OE) is also used to control the passing of write data (WRITE_DATA) to the output buffer 110d and the DDR memory chip 102.

As described above with respect to FIGS. 2–11, the delay device 10e generates a delayed timing signal TS_OUT in response to an input timing signal TS. The delay between leading and trailing edges of the delayed timing signal TS_OUT and corresponding leading and trailing edges of the input timing signal TS may equal a percent-of-clock period delay, which may be increased somewhat by a nominal buffer delay (see, e.g., FIG. 4C) that may be matched elsewhere on the processor chip 104. Thus, for example, the delay device 10e may be configured to provide a 20% clock period delay, where the clock period is measured as the period of the system clock signal SYSCLK. This percent-of-clock period delay automatically adjusts to account for changes in the period of the system clock signal SYSCLK. These changes in the period of the system clock may be a result of noise, temperature variations, etc.

For example, if the delay device 10e is configured in accordance with FIG. 2 and if the differential amplifier delay elements DIFFA of FIG. 2B are configured to provide a delay of 0.1 ns, then a system clock signal SYSCLK having a period of 10 ns will translate into an active period of 80 ns for the ring oscillator 12 and a count value of 20 being recorded by the first latch 16. (See, e.g., FIG. 2A). When loaded by the second latch 18, a count value of 20 will be decoded and result in the following injection control signal: INJECT[63:21]=1, INJECT[20]=0 and INJECT[19:0]=1, which selects 20 of the rightmost delay elements in the digital delay line 22 as being active to pass the received timing signal TS (provided by the buffer 110b). In the illustrated application, this timing signal TS is treated as a buffered version of the DQS strobe signal (DQS_CLK). The selection of 20 delay elements yields a delay of 2 ns=(20 delay elements)(0.1 ns/delay element), which is a 20% delay. Alternatively, a system clock signal SYSCLK having a period of 12 ns will translate into an active period of 96 ns for the ring oscillator 12 and a count value of 24 being recorded by the first latch 16. When loaded by the second latch 18, a count value of 24 will be decoded and result in the following injection control signal: INJECT[63:25]=1, INJECT[24]=0 and INJECT[23:0]=1, which selects 24 of the rightmost delay elements in the digital delay line 22 as being active to pass the received timing signal TS. This yields a delay of 2.4 ns=(24 delay elements)(0.1 ns/delay element), which is a 20% delay.

As a final example, a system clock signal SYSCLK having a period of 6 ns will translate into an active period of 48 ns for the ring oscillator 12 and a count value of 12 being recorded by the first latch 16. When loaded by the second latch 18, a count value of 12 will be decoded and result in the following injection control signal: INJECT[63:13]=1, INJECT[12]=0 and INJECT[11:0]=1, which selects 12 of the rightmost delay elements in the digital delay line 22 as being active to pass the received timing signal TS. This yields a delay of 1.2 ns=(12 delay elements)(0.1 ns/delay element), which is a 20% delay. Accordingly, if a sum of the delays provided by buffer 110b, BUFFB (the delay provided by this delay element within the delay device 10e may be negligible) and buffer 114 (or inverter 112) and associated wiring is matched to a sum of the delays provided by buffers 110c and 110e and associated wiring and if the strobe signal DQS_CLK and data signal generated by the memory chip 102 are in phase and other delay and skew factors are ignored (and balanced setup and hold times are assumed), then a delay between a time when the data at the input of the second latch 108b is first valid and a rising edge of the data strobe signal/DQS' occurs will equal 20% of the period of the system clock signal SYSCLK. Thus, if the frequency of the system clock SYSCLK is 133 MHz, the delay will equal about 1.5 ns.

Figure 13A:
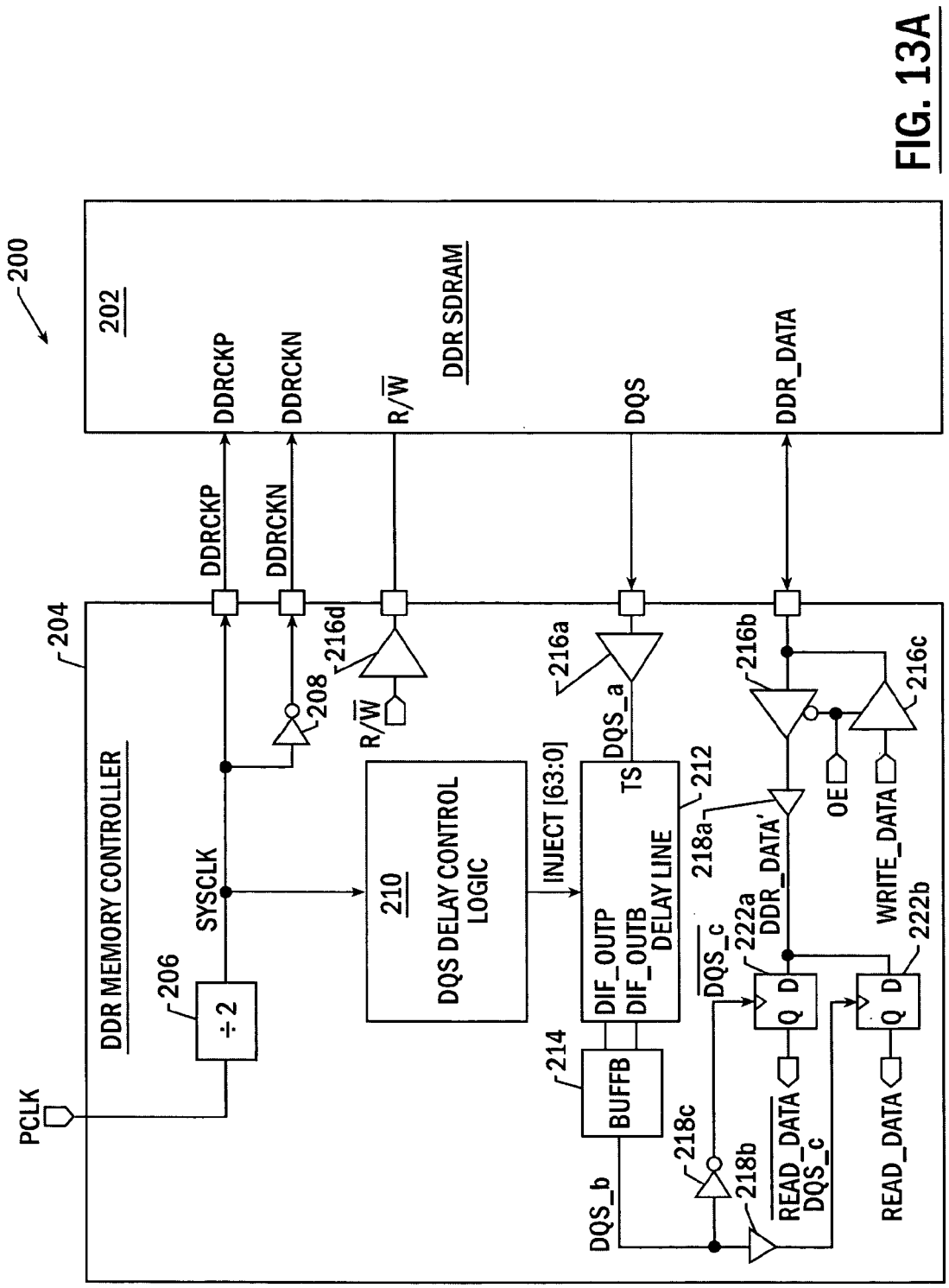
FIG. 13A is a block diagram of a multi-chip integrated circuit system having a DDR SDRAM memory chip and DDR memory controller according to further embodiments of the present invention.

Referring now to FIG. 13A, a multi-chip integrated circuit system 200 according to a further embodiment of the present invention will be described. This system 200 includes a dual data rate (DDR) memory controller chip 204 and a DDR memory chip 202, which is illustrated as a DDR synchronous DRAM (SDRAM) device. The memory controller chip 204 is illustrated as including a divide-by-two clock generator 206. This internal clock generator 206 is configured to generate a system clock signal SYSCLK in response to an internal clock signal PCLK, which may be generated elsewhere on the memory controller chip 204. The system clock signal SYSCLK may be split into a pair of clock signals that are 180° out of phase relative to each other, using an inverter 208. This pair of clock signals (DDRCKP, DDRCKN) is provided across a pair of I/O pins to the DDR memory chip 202, as illustrated. The memory controller chip 204 also uses a driver 218d to provide the DDR memory chip 202 with a read/write control signal (R/$\overline{\text{W}}$).

The illustrated memory controller chip 204 also includes control logic 210. This control logic 210 is configured to generate a control signal, shown as INJECT[63:0], which specifies an amount of delay to be provided to a signal received at the TS input of the delay line 212. The delay line 212 may be configured to generate a differential output signal that is passed to a differential output buffer 214 (shown as BUFFB), which may provide a negligible delay (e.g., 40 ps). To achieve a high level of power supply and ground noise immunity, the delay line 212 may be responsive to a pair of bias signals (e.g., PBIAS, NBIAS), as illustrated by FIG. 2B. The combination of these bias signals and the fine delay associated with each delay element in the delay line 212 facilitates the achievement of a timing error margin for the delay line 212 that is no greater than about ±0.2 ns over rated ranges of temperature variations (i.e., −40 to 125° F.) and power supply voltage variations (1.2V±10%). In some embodiments, the control logic 210 may include the logic similar to the logic illustrated by FIGS. 1D and 2. In other embodiments, the control logic 210 may include delay tree elements that are described more fully in the aforementioned U.S. application Ser. No. 10/094,101, filed Mar. 8, 2002.

The timing signal input TS is shown as receiving a buffered data strobe signal DQS_a. This buffered data strobe signal DQS_a is generated by an input buffer 216a. This input buffer 216a receives a data strobe signal DQS that is generated by the DDR memory chip 202 and provided to an input pin of the memory controller 204. As described more fully herein, the data strobe signal DQS (and system clock signal SYSCLK) can have a high frequency of about 133 MHz, however, other frequencies (e.g., 90, 100 or 116 MHz) are also possible. This frequency of 133 MHz corresponds to a DDR data bandwidth of 266 Mwords/sec. To provide these high read data bandwidths, the generated data strobe signal DQS is preferably a non-free-running clock signal that is edge-aligned with a data signal DDR_DATA generated by the DDR memory chip 202. This means that the data strobe signal DQS and data signal DDR_DATA are clocked out of the DDR memory chip 202 by the same internal clock signal and will transition at the outputs at nominally the same time. This internal clock signal may be edge-aligned to pair of clock signals (DDRCKP, DDRCKN) provided by the memory controller 204.

The memory controller chip 204 internally delays the received data strobe signal DQS in order to align it with the center of the eye (i.e., center of the minimum data valid window 'DV) of a data signal to be captured. The amount of time by which the data strobe signal DQS is delayed by the controller is represented by 'SD. The optimal value of 'SD is (skew'+data valid')÷2, where skew' and data valid' are the skew and data valid regions after board-level effects are factored in (i.e., the skew and valid regions appearing at the controller inputs as opposed to the DRAM outputs). These aspects of computing a minimum data valid window 'DV and the optimal delay value of 'SD are more fully described in an article by K. Ryan entitled "DDR SDRAM Functionality and Controller Read Data Capture," which was disclosed in a quarterly publication by Micron Technology, Inc., entitled "Design Line," Vol. 8, Issue No. 3, pp. 1–24 (1999), the disclosure of which is hereby incorporated herein by reference. The skews' and data valid' regions are illustrated by FIG. 17 of the aforementioned Ryan article. As will be understood by those skilled in the art, board-level effects will increase the skew among the signal transitions and therefore reduce the data valid window by the same amount. The optimal value for 'SD assumes that balanced setup and hold times (for data relative to the strobe) are achieved at the capture flip-flops (see, e.g., D-type latches 222a–222b in FIG. 13A). In the event the strobe is centered in the skew region, as shown in FIG. 18 of the Ryan article, the delay value 'SD is equal to one-half the skew' region plus one-half the data valid' region. As described more fully at pages 18–24 of the Ryan article, the three types of delay that can be implemented in a controller are (i) a predetermined absolute delay value, (ii) a selectable delay value, and (iii) a percent-of-clock period delay (see, e.g., Ryan article, FIG. 35, master-slave approach for providing 20% of clock period delay).

The data signal DDR_DATA received by the memory controller 204 is illustrated as being passed through a pair of buffer devices, shown as 216b and 218a. The buffer devices 216b and 216c are responsive to an output enable signal OE. When the output enable signal OE is set to a high logic level, write data WRITE_DATA is passed from the memory controller 204 to the DDR memory chip 202, as illustrated. However, when the output enable signal OE is set to a logic low level, the buffer device 216b is active to receive the data signal DDR_DATA from the memory chip 202. The buffered data signal, shown as DDR_DATA', is captured by a pair of latches 222a and 222b at a data rate of 266Mwords/sec. The capture of read data by the latches 222a and 222b is synchronized with a pair of capture strobe signals, shown as DQS_c and /DQS_c. This pair of capture strobe signals is generated by a pair of buffers 218b–218c, which are responsive to a delayed data strobe signal DQS_b. This delayed data strobe signal DQS_b is illustrated as a being generated at an output of the differential output buffer 214. As described more fully hereinabove with respect to FIGS. 1–11, the delayed data strobe signal DQS_b is delayed by 20% of the clock period of the system clock signal SYSCLK, relative to the buffered data strobe signal DQS_a that is received at an input TS of the delay line 212. Thus, assuming a frequency of the system clock signal SYSCLK of 133 MHz, a delay value 'SD of about 1.5 ns is preferably achieved. To achieve a high level of overlap between each rising (R) and falling (F) edge of the delayed data strobe signal DQS_b and the data valid windows 'DV associated with the buffered data signal DDR_DATA', a sum of the delays provided by buffers 216a, 214 and 218b (or 218c) in the strobe signal path is preferably matched with a sum of the delays provided by buffers 216b and 218a in the read data path.

Figure 13B:
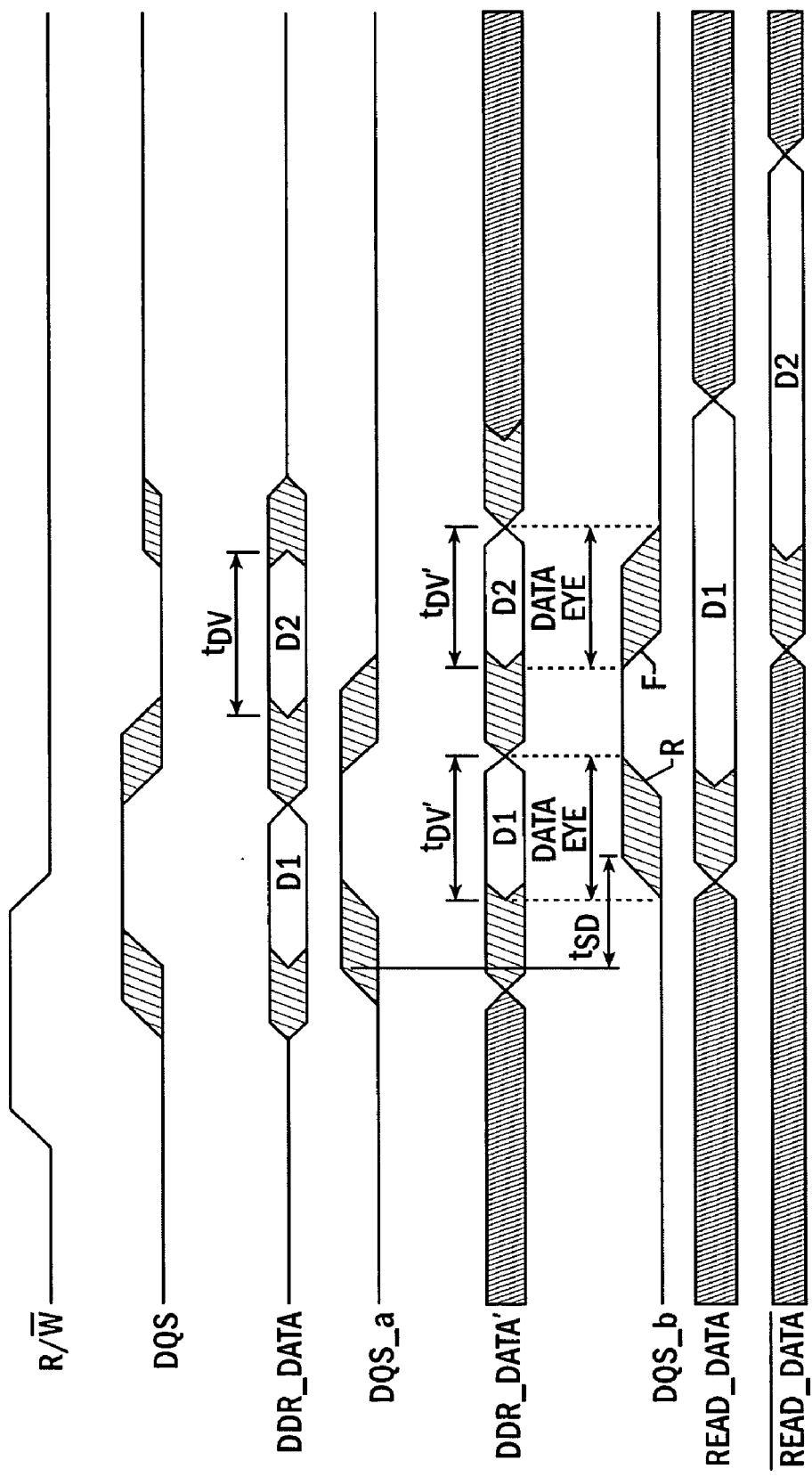
FIG. 13B is a timing diagram that illustrates operation of the multi-chip integrated circuit system of FIG. 13A.

The high degree of precision between the timing of the high frequency data strobe signals and the data signals DDR_DATA and DDR_DATA' is more fully illustrated by FIG. 13B. In FIG. 13B, the data strobe signal DQS and the data signal DDR_DATA(e.g., D1, D2, . . . ) are edge aligned by the memory chip 202. However, the delayed data strobe signal DQS_b is delayed by the delay value 'SD (relative to the buffered data strobe signal DQS_a) so that each rising edge (R) and falling edge (F) of the delayed data strobe signal DQS_b is centered within a respective data valid window 'DV. This delay 'SD accurately tracks changes in the frequency of the system clock signal SYSCLK (and the data strobe signal DQS) and is highly resistant to power supply and ground noise. This is also important because the DDR memory chip also varies its data window with respect to DDRCKP in a manner that is equal to SYSCLK. The delayed data strobe signal DQS_b is then used to synchronize the capture of the buffered data signal DDR_DATA'. This capture results in the generation of a pair of read data signals, shown as READ_DATA and /READ_DATA. According to preferred aspects of this embodiment of FIG. 13A, the data valid window 'DV associated with the buffered version of the data signal DDR_DATA' at the time of read capture is in a range between about 1.55 ns and about 1.7 ns and, more typically, is in a narrower range between about 1.6 ns and about 1.65 ns when the period of SYSCLK and DDRCKP is 7.5 ns.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A digital delay line, comprising:
a cascaded string of delay elements having a plurality of injection ports, said cascaded string of delay elements responsive to an injection control signal that designates which of the plurality of injection ports is enabled to accept an input signal to be delayed.

2. The delay line of claim 1, wherein the plurality of injection ports are electrically coupled together.

3. The delay line of claim 2, wherein each of the plurality of injection ports comprises a respective pair of differential injection terminals.

4. The delay line of claim 3, wherein each of a plurality of true injection terminals associated with the plurality of injection ports are electrically connected together; and wherein each of a plurality of complementary injection terminals associated with the plurality of injection ports are electrically coupled together.

5. The delay line of claim 4, wherein the injection control signal is a multi-bit wide signal; and wherein each of a plurality of delay elements in said cascaded string of delay elements has a pair of differential inputs and a pair of differential outputs.

6. The delay line of claim 5, wherein each of the plurality of delay elements in said cascaded string of delay elements is responsive to first and second bias signals that are floated at first and second voltage levels, respectively, when said cascaded string of delay elements is active.

7. The delay line of claim 6, further comprising first and second bias signal generators that are configured to generate the first and second bias signals, respectively, in response to a strobe signal.

8. The delay line of claim 1, wherein each of a plurality of delay elements in said cascaded string of delay elements has a pair of differential inputs and a pair of differential outputs.

9. The delay line of claim 8, wherein each of the plurality of delay elements in said cascaded string of delay elements is responsive to a first floating bias signal that tracks variations in a power supply voltage provided to said cascaded string of delay elements.

10. The delay line of claim 1, wherein each of a plurality of delay elements in said cascaded string of delay elements is responsive to first and second floating bias signals that are provided on first and second bias signal lines, respectively.

11. The delay line of claim 10, further comprising:
a first bias signal generator that is configured to intermittently pump the first bias signal line with displacement current; and
a second bias signal generator that is configured to intermittently pump the second bias signal line with displacement current.

12. The delay line of claim 11, wherein said first and second bias signal generators are configured to provide high impedance outputs to said first and second bias signal lines, respectively, when said cascaded string of delay elements is active.

13. The delay line of claim 12, wherein said first bias signal generator comprises:
   a first capacitor having a first electrode electrically connected to a first intermediate bias node;
   a first switch having first and second current carrying terminals electrically connected to the first intermediate bias node and the first bias signal line, respectively; and
   a second switch having first and second current carrying terminals electrically connected to the first intermediate bias node and a reference line, respectively.

14. The delay line of claim 13, wherein a second electrode of said first capacitor is electrically connected to a power supply line.

15. The delay line of claim 14, wherein said second bias signal generator comprises:
   a second capacitor having a first electrode electrically connected to a second intermediate bias node;
   a third switch having first and second current carrying terminals electrically connected to the second intermediate bias node and the second bias signal line, respectively; and
   a fourth switch having a first current carrying terminal electrically coupled to the second intermediate bias node.

16. The delay line of claim 15, wherein a second electrode of said second capacitor is electrically connected to the reference line.

17. The delay line of claim 16, wherein said second bias signal generator comprises a voltage divider; and wherein said fourth switch comprises a second current carrying terminal electrically connected to an output of said voltage divider.

18. The delay line of claim 17, wherein said voltage divider comprises:
   a normally-on PMOS pull-up transistor; and
   an NMOS pull-down transistor having gate and drain terminals that are commonly connected to a drain terminal of said normally-on PMOS pull-up transistor at the output of said voltage divider.

19. The delay line of claim 13, wherein said first and second switches comprise first and second MOS transistors, respectively; and wherein said first bias signal generator comprises a first bias control circuit that is electrically coupled to gate electrodes of the first and second MOS transistors.

20. The delay line of claim 19, wherein the first bias control circuit is responsive to a strobe signal and a reset signal.

21. The delay line of claim 20, wherein the first bias control circuit is configured to turn on the first and second switches simultaneously when the reset signal is active.

22. The delay line of claim 15, wherein said first, second, third and fourth switches comprise first, second, third and fourth MOS transistors, respectively; wherein said first bias signal generator comprises a first bias control circuit that is electrically coupled to gate electrodes of the first and second MOS transistors; and wherein said second bias signal generator comprises a second bias control circuit that is electrically coupled to gate electrodes of the third and fourth MOS transistors.

23. The delay line of claim 22, wherein the first and second bias control circuits are configured to turn on the first, second, third and fourth switches simultaneously in response to an active reset signal.

24. The delay line of claim 1, wherein the injection control signal is a multi-bit wide signal; and wherein each of a plurality of delay elements in said cascaded string of delay elements comprises an injection control terminal that receives a respective bit of the injection control signal.

25. The delay line of claim 24, further comprising a decoder having a plurality of outputs that are electrically coupled to the injection control terminals of the plurality of delay elements.

26. An integrated circuit delay element, comprising:
   a differential amplifier having a pair of differential inputs and a pair of differential outputs;
   a first load transistor having a first current carrying terminal electrically coupled to a true one of the pair of differential outputs;
   a second load transistor having a first current carrying terminal electrically coupled to a complementary one of the pair of differential outputs;
   a first bias signal line electrically coupled to gate electrodes of said first and second load transistors; and
   a first bias signal generator that is configured to float said first bias signal line at a first bias voltage when said differential amplifier is active.

27. The delay element of claim 26, wherein second current carrying terminals of said first and second load transistors are electrically coupled to a power supply line.

28. The delay element of claim 27, wherein said first bias signal generator is configured to intermittently pump said first bias signal line with displacement current during when said differential amplifier is inactive.

29. The delay element of claim 28, wherein said first bias signal generator comprises:
   a pull-up capacitor having a first electrode electrically coupled to the power supply line; and
   a first switch having a first current carrying terminal electrically connected to a second electrode of said pull-up capacitor and a second current carrying terminal electrically connected to said first bias signal line.

30. The delay element of claim 29, wherein a capacitance of said first bias signal line is greater than about 100 times a capacitance of said pull-up capacitor.

31. The delay element of claim 29, wherein said first bias signal generator further comprises a second switch having a first current carrying terminal electrically connected to the second electrode of said pull-up capacitor and a second current carrying terminal electrically connected to a reference line.

32. The delay element of claim 26, wherein said first bias signal generator is configured to pump said first bias signal line with positive displacement current during at least a first interval when said differential amplifier is inactive and is further configured to pump said first bias signal line with negative displacement current during at least a second interval when said differential amplifier is inactive.

33. The delay element of claim 26, wherein said differential amplifier comprises:
   a first pair of input transistors having first current carrying terminals that are electrically connected together; and
   a pull-down current source electrically coupled to the first current carrying terminals of said first pair of input transistors.

34. The delay element of claim 33, further comprising:
   a second bias signal line electrically connected to a control input of said pull-down current source; and
   a second bias signal generator that is configured to float said second bias signal line at a second bias voltage when said differential amplifier is active.

35. The delay element of claim 34, wherein said second bias signal generator is configured to intermittently pump said second bias signal line with displacement current when said differential amplifier is inactive.

36. The delay element of claim 34, wherein said second bias signal generator is configured to pump said second bias signal line with positive or negative displacement current when said differential amplifier is inactive.

37. The delay element of claim 35, wherein a capacitance of said second bias signal line is greater than about 100 times a capacitance of said pull-down capacitor; and wherein said second bias signal generator comprises:
   a pull-down capacitor having a first electrode electrically coupled to a ground reference line; and
   a first switch having a first current carrying terminal electrically connected to a second electrode of said pull-down capacitor and a second current carrying terminal electrically connected to said second bias signal line.

38. The delay element of claim 37, wherein said second bias signal generator further comprises:
   a second switch having a first current carrying terminal electrically connected to the second electrode of said pull-down capacitor; and
   a voltage divider that is electrically coupled between a power supply line and the ground reference line and has an output that is electrically connected to a second current carrying terminal of said second switch.

39. The delay element of claim 33, wherein said pull-down current source comprises a totem pole arrangement of first and second NMOS pull-down transistors that extend between the first current carrying terminals of said first pair of input transistors and a reference line.

40. The delay element of claim 39, wherein a gate electrode of the first NMOS pull-down transistor is responsive to an injection control signal; and wherein a gate electrode of the second NMOS pull-down transistor is electrically connected to a second bias signal line.

41. The delay element of claim 40, further comprising a second bias signal generator that is configured to float the second bias signal line when said differential amplifier is active and is further configured to intermittently pump the second bias signal line with displacement current when said differential amplifier is inactive.

42. An integrated circuit delay element, comprising:
   a differential amplifier having a pair of differential inputs and a pair of differential outputs, said differential amplifier comprising a first pair of NMOS input transistors having commonly connected first current carrying terminals and a pull-down current source electrically coupled to the first current carrying terminals of said first pair of input transistors;
   a first PMOS load transistor having a first current carrying terminal electrically coupled to a true one of the pair of differential outputs and a second current carrying terminal electrically coupled to a power supply line;
   a second PMOS load transistor having a first current carrying terminal electrically coupled to a complementary one of the pair of differential outputs and a second current carrying terminal electrically coupled to the power supply line;
   a first bias signal line electrically coupled to gate electrodes of said first and second PMOS load transistors;
   a first bias signal generator that is configured to float said first bias signal line at a first bias voltage when said differential amplifier is active and is further configured to pump said first bias signal line with positive or negative displacement current when said differential amplifier is inactive;
   a second bias signal line electrically connected to a control input of the pull-down current source; and
   a second bias signal generator that is configured to float said second bias signal line at a second bias voltage when said differential amplifier is active and is further configured to pump said second bias signal line with positive or negative displacement current when said differential amplifier is inactive.

43. A digital delay line, comprising:
   a first bias signal line;
   a cascaded string of differential amplifier delay elements having respective load devices that are electrically coupled to said first bias signal line; and
   a first bias signal generator that is configured to float said first bias signal line at a first bias voltage when said cascaded string of differential amplifier delay elements is active and is further configured to intermittently pump said first bias signal line with displacement current when said cascaded string of differential amplifier delay elements is inactive.

44. A digital delay line, comprising:
   at least one differential amplifier delay element having an injection port that is responsive to an injection control signal and a pair of differential outputs that are electrically coupled to the injection port.

45. The digital delay line of claim 44, wherein said at least one differential amplifier delay element comprises a current source that is responsive to the injection control signal.

46. An integrated circuit delay line, comprising:
   a differential amplifier delay element having a pair of differential inputs and a pair of differential outputs, said differential amplifier comprising a first pair of NMOS input transistors having commonly connected first current carrying terminals and a pull-down current source electrically coupled to the first current carrying terminals of said first pair of input transistors;
   a first PMOS load transistor having a first current carrying terminal electrically coupled to a true one of the pair of differential outputs and a second current carrying terminal electrically coupled to a power supply line;
   a second PMOS load transistor having a first current carrying terminal electrically coupled to a complementary one of the pair of differential outputs and a second current carrying terminal electrically coupled to the power supply line; and
   an injection port that is electrically coupled to the pair of differential outputs.

47. The delay line of claim 46, wherein said injection port comprises a true injection terminal switch that is electrically coupled to the true one of the pair of differential outputs and a complementary injection terminal switch that is electrically coupled to the complementary one of the pair of differential outputs.

48. The delay line of claim 47, wherein the true injection terminal switch and the complementary injection terminal switch have commonly connected control terminals that are responsive to an injection control signal.

49. The delay line of claim 48, wherein the pull-down current source is responsive to the injection control signal and is configured to be inactive when the injection control signal is active at a level that opens the injection port by turning on the true and complementary injection terminal switches.

50. The delay line of claim 49, wherein the true and complementary injection terminal switches are MOS transistors.

51. The delay line of claim 50, wherein the true and complementary injection terminal switches are electrically coupled to a pair of differential timing signal lines.

52. The delay line of claim 49, further comprising:
- a first bias signal line electrically coupled to gate electrodes of said first and second PMOS load transistors;
- a first bias signal generator that is configured to float said first bias signal line at a first bias voltage when said differential amplifier is active and is further configured to pump said first bias signal line with positive or negative displacement current when said differential amplifier is inactive;
- a second bias signal line electrically connected to a control input of the pull-down current source; and
- a second bias signal generator that is configured to float said second bias signal line at a second bias voltage when said differential amplifier is active and is further configured to pump said second bias signal line with positive or negative displacement current when said differential amplifier is inactive.

53. The delay line of claim 46, further comprising:
- a first bias signal line electrically coupled to gate electrodes of said first and second PMOS load transistors;
- a first bias signal generator that is configured to float said first bias signal line at a first bias potential when said differential amplifier is active and is further configured to pump said first bias signal line with positive or negative displacement current when said differential amplifier is inactive;
- a second bias signal line electrically connected to a control input of the pull-down current source; and
- a second bias signal generator that is configured to float said second bias signal line at a second bias potential when said differential amplifier is active and is further configured to pump said second bias signal line with positive or negative displacement current when said differential amplifier is inactive.

54. The delay line of claim 1, wherein said cascaded string of delay elements comprises a cascaded string of differential delay elements that are responsive to first and second bias signals.

55. The delay line of claim 54, further comprising a bias signal generator configured to periodically adjust magnitudes of the first and second bias signals in-sync with a strobe signal.

56. An integrated circuit system, comprising:
- a first integrated circuit chip that is configured to generate data and strobe signals at outputs thereof; and
- a second integrated circuit chip that receives the data and strobe signals and latches a buffered version of the data signal in-sync with leading edges of a pair of complementary strobe signals that are derived from a delayed timing signal, said second integrated circuit chip having a delay device therein that comprises a digital delay line having a cascaded string of delay elements therein that are each associated with a corresponding one of a plurality of injection ports having a differential injection terminals, said digital delay line configured to generate the delayed timing signal by adding at least a percent-of-clock period delay to a timing signal that is derived from the strobe signal and accepted at an enabled one of the plurality of injection ports of the digital delay line, and further configured to be responsive to an injection control signal having a value that sets a length of the delay by specifying a location of the enabled one of the plurality of injection ports.

57. The integrated circuit system of claim 56, wherein said delay device is responsive to a system clock signal having a period that sets the length of the period from which the percent-of-clock period delay is measured; and wherein said first integrated circuit chip is responsive to a buffered version of the system clock signal.

58. The integrated circuit system of claim 57, wherein said first integrated circuit chip comprises a delay locked loop that receives the buffered version of the system clock signal.

59. The integrated circuit system of claim 56, wherein said first integrated circuit chip comprises a dual data rate (DDR) memory device.

60. The integrated circuit system of claim 59, wherein the dual data rate (DDR) memory device is a DDR FIFO, said DDR FIFO comprising a plurality of memory devices that are configured to support any combination of dual data rate (DDR) or single data rate (SDR) write modes that operate in-sync with a write clock signal and DDR or SDR read modes that operate in-sync with a read clock signal.

* * * * *